US009142563B2

(12) United States Patent
Chang et al.

(10) Patent No.: US 9,142,563 B2
(45) Date of Patent: Sep. 22, 2015

(54) THREE DIMENSIONAL SEMICONDUCTOR MEMORY DEVICES AND METHODS OF FABRICATING THE SAME

(71) Applicant: SAMSUNG ELECTRONICS CO., LTD., Suwon-Si, Gyeonggi-Do (KR)

(72) Inventors: Sung-Il Chang, Hwaseong-si (KR); Youngwoo Park, Seoul (KR); Jaegoo Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/599,621

(22) Filed: Jan. 19, 2015

(65) Prior Publication Data

US 2015/0132906 A1    May 14, 2015

Related U.S. Application Data

(63) Continuation of application No. 13/222,173, filed on Aug. 31, 2011, now Pat. No. 8,952,443.

(30) Foreign Application Priority Data

Sep. 1, 2010    (KR) .................. 10-2010-0085647

(51) Int. Cl.
*H01L 29/792* (2006.01)
*H01L 27/115* (2006.01)
*H01L 21/311* (2006.01)

(52) U.S. Cl.
CPC .... *H01L 27/11582* (2013.01); *H01L 21/31111* (2013.01); *H01L 27/11556* (2013.01)

(58) Field of Classification Search
CPC .............. H01L 27/11551; H01L 27/11582; H01L 27/11556; H01L 21/28273; H01L 27/11578; H01L 21/28282
USPC .................................. 438/591, 268, 270, 667
See application file for complete search history.

(56) References Cited

U.S. PATENT DOCUMENTS 6,936,925 B1 * 8/2005 Lopatin et al. ................ 257/762
8,193,571 B2 * 6/2012 Katsumata et al. ........... 257/302

(Continued)

FOREIGN PATENT DOCUMENTS

JP    2008-171838    7/2008
JP    2010-040122    2/2010

(Continued)

OTHER PUBLICATIONS

Corresponding U.S. Appl. No. 12/953,748.

(Continued)

*Primary Examiner* — Jaehwan Oh
(74) *Attorney, Agent, or Firm* — Volentine & Whitt, PLLC

(57) ABSTRACT

A 3D semiconductor device includes an electrode structure has electrodes stacked on a substrate, semiconductor patterns penetrating the electrode structure, charge storing patterns interposed between the semiconductor patterns and the electrode structure, and blocking insulating patterns interposed between the charge storing patterns and the electrode structure. Each of the blocking insulating patterns surrounds the semiconductor patterns, and the charge storing patterns are horizontally spaced from each other and configured in such a way as to each be disposed around a respective one of the semiconductor patterns. Also, each of the charge storing patterns includes a plurality of horizontal segments, each interposed between vertically adjacent ones of the electrodes.

6 Claims, 25 Drawing Sheets

(56) References Cited

U.S. PATENT DOCUMENTS

| | | | |
|---|---|---|---|
| 8,309,405 B2* | 11/2012 | Yang et al. | 438/156 |
| 8,426,299 B2* | 4/2013 | Kim et al. | 438/585 |
| 8,664,101 B2* | 3/2014 | Kim et al. | 438/591 |
| 8,685,821 B2* | 4/2014 | Eom et al. | 438/268 |
| 8,697,498 B2* | 4/2014 | Jang et al. | 438/128 |
| 8,697,524 B2* | 4/2014 | You et al. | 438/288 |
| 8,883,576 B2* | 11/2014 | Lee et al. | 438/156 |
| 2006/0166498 A1* | 7/2006 | Kirby | 438/667 |
| 2009/0310415 A1 | 12/2009 | Jin et al. | |
| 2010/0034028 A1 | 2/2010 | Katsumata et al. | |
| 2010/0038699 A1* | 2/2010 | Katsumata et al. | 257/324 |
| 2010/0072538 A1* | 3/2010 | Kito et al. | 257/326 |
| 2010/0078701 A1 | 4/2010 | Shim et al. | |
| 2010/0270593 A1* | 10/2010 | Lung et al. | 257/208 |
| 2011/0092038 A1 | 4/2011 | Choi et al. | |
| 2011/0115014 A1* | 5/2011 | Ichinose et al. | 257/324 |
| 2011/0233644 A1* | 9/2011 | Fukuzumi et al. | 257/324 |

FOREIGN PATENT DOCUMENTS

| | | |
|---|---|---|
| JP | 2010-045314 | 2/2010 |
| KR | 1020100021981 A | 2/2010 |

OTHER PUBLICATIONS

Corresponding U.S. Appl. No. 12/981,625.

Corresponding U.S. Appl. No. 13/012,485.

H. Tanaka et al., "Bit Cost Scalable Technology with Punch and Plug Process for Ultra High Density Flash Memory", Symposium on VLSI Technology Digest of Technical Papers, pp. 14-15 (2007).

Jang J. et al, "Vertical cell array using TCAT (Terabit Cell Array Transistor) technology for ultra high density NAND flash memory", Simposium on VLSI Technology Digest of Technical Papers, pp. 192-193, (2009).

* cited by examiner

US 9,142,563 B2

THREE DIMENSIONAL SEMICONDUCTOR MEMORY DEVICES AND METHODS OF FABRICATING THE SAME

PRIORITY STATEMENT

This application is a Continuation Application of U.S. patent application Ser. No. 13/222,173, filed Aug. 31, 2011, which is a U.S. non-provisional patent application claims priority under 35 U.S.C. §119 to Korean Patent Application No. 10-2010-0085647, filed on Sep. 1, 2010, in the Korean Intellectual Property Office.

BACKGROUND

The inventive concept relates to three-dimensional semiconductor memory devices and to methods of fabricating the same. In particular, the inventive concept relates to semiconductor devices having a three-dimensional arrangement of memory cells and to methods of fabricating the same.

Techniques aimed at increasing the capacity of an electronic memory device include (1) pattern miniaturization and (2) multi-level cell (MLC) techniques. However, pattern miniaturization entails relatively expensive manufacturing processes; and the overall memory capacity that can be attained by employing an MLC technique is limited because only a certain number of bits can be stored in each cell fabricated using the technique. 3D-IC memory techniques have also been developed with an aim towards increasing memory capacity. A 3D-IC memory technique generally refers to any technique of arranging memory cells three-dimensionally. Thus, a 3D-IC technique may be used in combination with pattern miniaturization and MLC techniques to realize even greater memory capacities.

One 3D-IC technique, of arranging memory cells three-dimensionally, is a punch-and-plug technique. The punch-and-plug technique includes sequentially forming multiple thin layers on a substrate and then forming plugs through the thin layers. This technique allows for a three-dimensional memory device to be realized without incurring relatively high manufacturing costs.

SUMMARY

According to one aspect of the inventive concept, there is provided a three-dimensional semiconductor device having a substrate, an electrode structure including electrodes stacked one over the other in a vertical direction on the substrate, patterns of semiconductor material extending through the electrode structure, patterns of charge storing material each of which is interposed between a respective one of the semiconductor patterns and the electrode structure, and blocking patterns of electrically insulating material interposed between the charge storing patterns and the electrode structure, and in which each of the blocking patterns is disposed in a respective layer of the device and surrounds the semiconductor patterns in the respective layer, the charge storing patterns are spaced from each other in a horizontal direction orthogonal to the vertical direction, each of the charge storing patterns surrounds a respective one of the semiconductor patterns, and each of the charge storing patterns has substantially horizontally planar segments between the electrodes.

According to another aspect of the inventive concept, there is provided a method of fabricating a 3D semiconductor device, which includes forming a mold structure of alternately disposed interlayer dielectrics and sacrificial layers vertically on a substrate, forming a vertical opening through the mold structure, recessing the interlayer dielectrics horizontally between the sacrificial layers to thereby form undercut regions at which the sacrificial layers are under-cut, forming a layer of charge storing material conformally over surfaces delimiting the opening and the recesses of the undercut regions, forming a pattern of semiconductor material in the opening in which the charge storing layer has been formed, and replacing the sacrificial layers with electrically conductive patterns.

According to still another aspect of the inventive concept, there is provided a three-dimensional semiconductor device having a substrate, a stack of electrodes disposed on the substrate and spaced vertically from each other such that a plurality of regions are defined between the electrodes in the vertical direction, respectively, a pattern of semiconductor material extending through the electrode structure and having horizontal sections each of which extends into a respective one of the regions, a layer of charge storing material which surrounds the semiconductor pattern and is interposed between the semiconductor pattern and the stack of electrodes, and at least one blocking layer of electrically insulating material interposed between the charge storing layer and the electrodes, and in which the charge storing layer has pairs of substantially planar segments oriented in the horizontal direction, and each pair of planar segments is disposed within a respective one of the regions on opposite sides of the horizontal section of the semiconductor pattern disposed in that region.

BRIEF DESCRIPTION OF THE DRAWINGS

The inventive concept will be more clearly understood from the following brief description of the preferred embodiments thereof made in conjunction with the accompanying drawings. That is, the accompanying drawings illustrate non-limiting examples of the inventive concept.

DETAILED DESCRIPTION OF THE PREFERRED EMBODIMENTS

Figure 1:
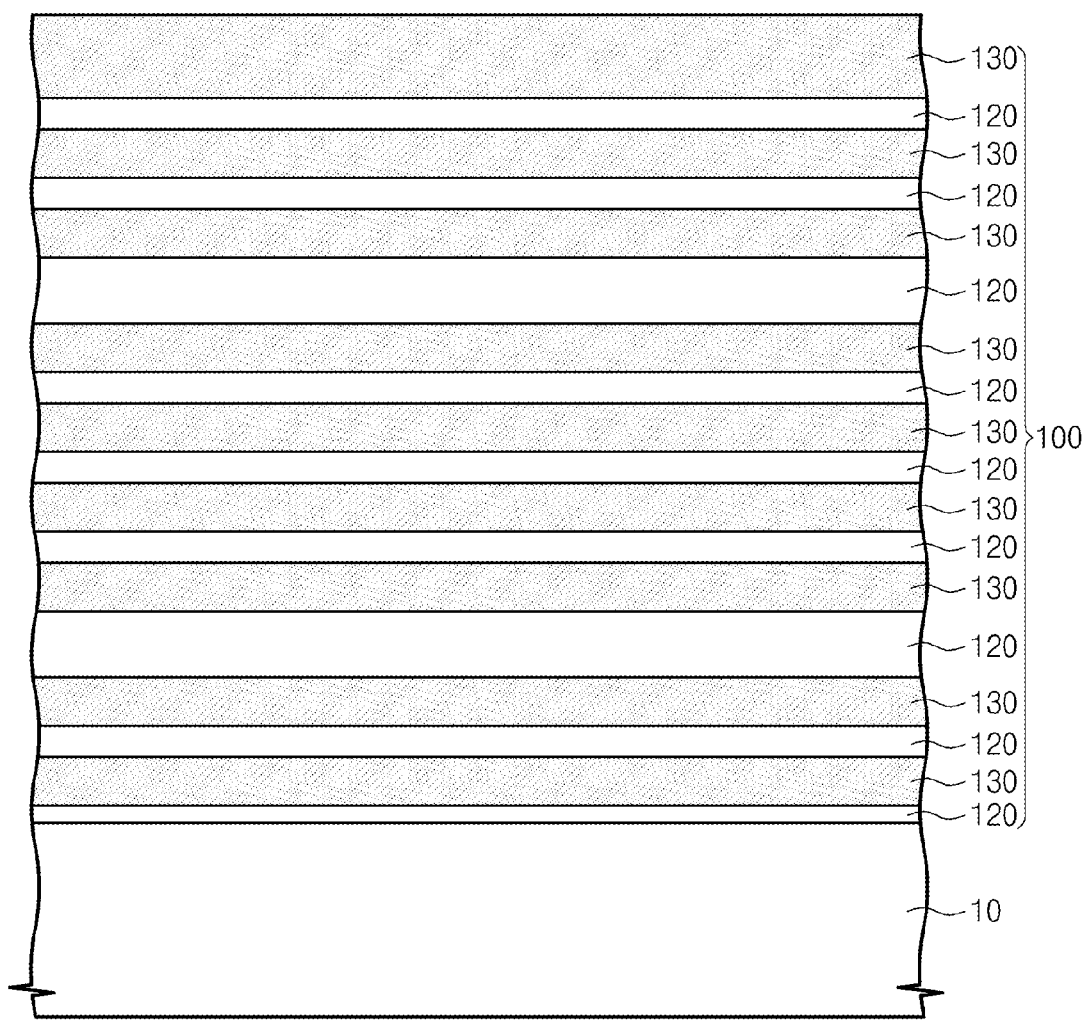
FIGS. 1 through 10 are sectional views illustrating a method of fabricating a three-dimensional semiconductor device according to the inventive concept.

Various embodiments and examples of embodiments of the inventive concept will be described more fully hereinafter with reference to the accompanying drawings. It should be noted that in the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Also, in the description that follows, spatially relative terms, such as "upper," "lower," "above," "below," "horizontal" and "vertical" are used to describe an element's and/or feature's positional relationship or orientation as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the term "semiconductor material" will refer to material that is itself considered a semiconductor by those skilled in the art or material that can have the property of a semiconductor such as phase change material. The terms "comprises" or "comprising" when used in this specification specifies the presence of stated features or processes but does not preclude the presence or additional features or processes.

Furthermore, as used herein, the term "and/or" includes any and all practical combinations of one or more of the associated listed items.

For the purposes of describing three-dimensional (3D) semiconductor devices and methods of fabricating the same, according to the inventive concept, reference will be made to a three-dimensional arrangement of memory cells and to methods of fabricating the same. The device itself, as will be apparent to those skilled in the art, may have a cell array region, a peripheral circuit region, a sense amp region, a decoding circuit region and a connection region. In this case, a three-dimensional arrangement of memory cells may be disposed/fabricated in the cell array region. Memory cells and bit lines and word lines are electrically connected to the memory cells in the cell array region. The peripheral circuit region has circuits for driving the memory cells, and the sense amp region has circuits for reading information stored in the memory cells. The connection region is interposed between the cell array region and the decoding circuit region, and wiring electrically connects the word lines with the circuitry of the decoding circuit region.

For certain technical features related to cell array and other regions of a semiconductor device (e.g., a peripheral region or a connection region), reference may be made to U.S. Patent Publication Nos. 2011/0147801, 2011/0092038, and 2009/0310415, the contents of which are hereby incorporated by reference. Reference may also be made to U.S. patent application Ser. Nos. 12/981,625 and 13/012,485, filed on Dec. 30, 2010 and Jan. 24, 2011, respectively, and the contents of which are also hereby incorporated by reference.

Furthermore, reference may also be made to U.S. patent application Ser. No. 13/012,485 for non-essential features of a multi-layered memory structure/fabrication method. In particular, a semiconductor device according to the inventive concept may be fabricated by repeatedly forming and stacking structures in the ways disclosed in U.S. patent application Ser. No. 13/012,485.

An embodiment of a method of fabricating a 3D semiconductor device according to the inventive concept will now be described with reference to FIGS. 1 through 10.

Referring first to FIG. 1, a mold structure 100 is formed on a substrate 10. The substrate 10 may comprise at least one material selected from the group consisting of semiconductor, conductive, and insulating materials. That is, the substrate 10 may have one or more layers. For example, the substrate 10 may be a silicon wafer. In this case, semiconductor material may also refer to a layer of material having the properties of a semiconductor. Furthermore, a lower structure (not shown) including at least one transistor may be formed on the substrate 10, so as to be interposed between the substrate 10 and the mold structure 100 once the mold structure 100 is formed. For simplicity, though, reference will be made to an example in which the mold structure 100 is formed directly on the substrate 10.

The mold structure 100 includes a plurality of sacrificial layers 130 and a plurality of interlayer dielectrics 120. The interlayer dielectrics 120 and the sacrificial layers 130 are stacked in an alternating fashion, as shown in FIG. 1. The sacrificial layers 130 are formed of material having an etch selectivity with respect to the material of the interlayer dielectrics 120 so that the interlayer dielectrics 120 are etched at a lower rate than the sacrificial layers 130. More specifically, the material of the sacrificial layers 130 preferably has an etch selectivity of 1:10 to 1:200, and more preferably of 1:30 to 1:100, with respect to the material of the interlayer dielectrics 120. For example, the interlayer dielectrics 120 may be formed of at least one of silicon oxide and silicon nitride, and the sacrificial layers 130 may be formed of at least one of silicon, silicon oxide, silicon carbide or silicon nitride. For the sake of simplicity, the description that follows will refer to an example of the present embodiment in which the interlayer dielectrics 120 are of silicon oxide and the sacrificial layers 130 are of silicon nitride.

Next, a capping layer (not shown) may be formed on the mold structure 100. In this case, the capping layer is preferably formed of material having an etch selectivity with respect to the sacrificial layers 130 and the interlayer dielectrics 120. For example, the capping layer may be formed of at least one material selected from the group consisting of silicon, silicon germanium and silicon carbide.

Figure 2:
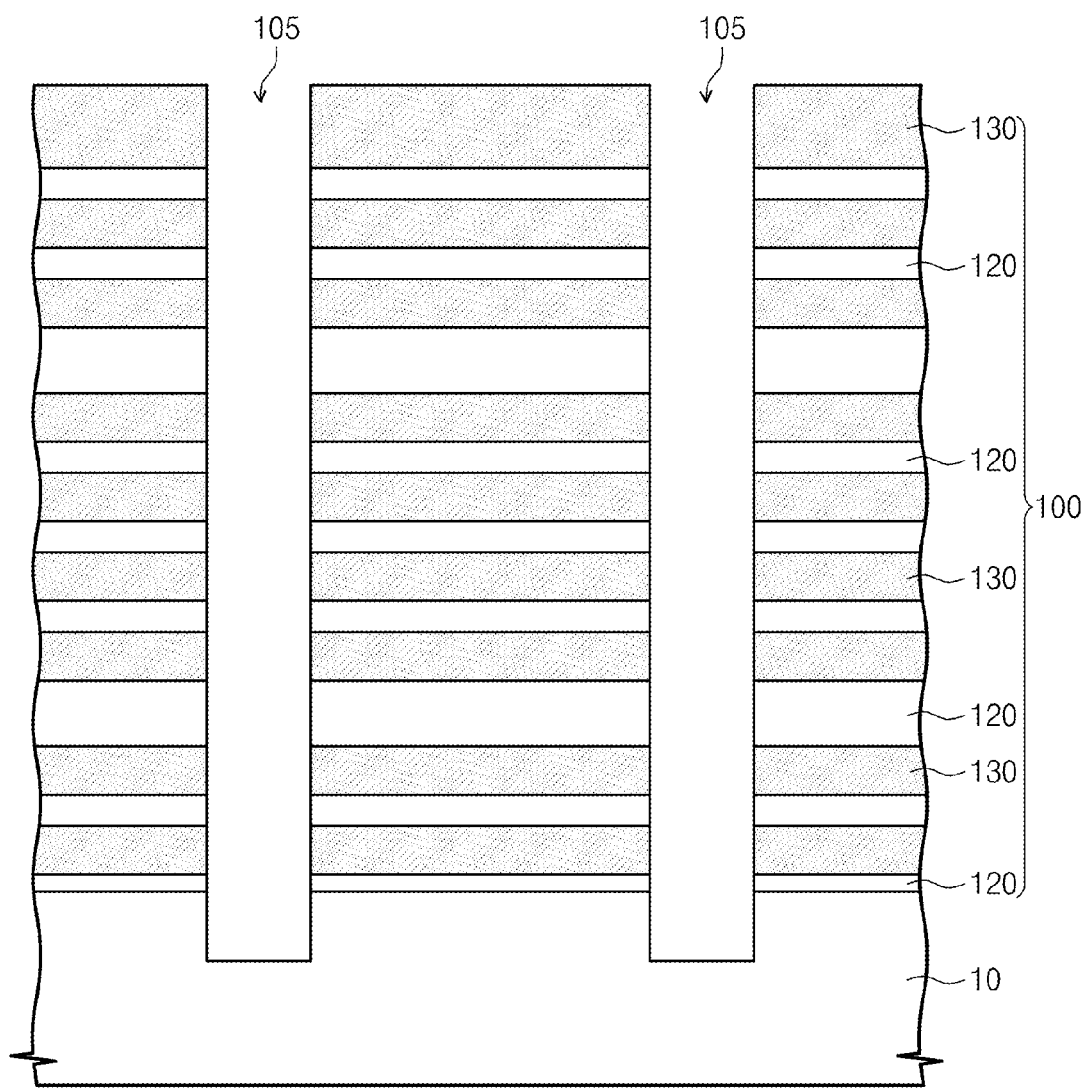

Referring to FIG. 2, openings 105 are formed through the mold structure 100. Accordingly, sidewall surfaces of the interlayer dielectrics 120 and the sacrificial layers 130 are exposed by the openings 105.

In an example of this embodiment, the openings 105 are in the form of holes. In this case, each of the openings 105 may be cylindrical and may have a depth that is at least five times its width (e.g., may have an aspect ratio of 5). In addition, the openings 105 may be arranged two-dimensionally across the substrate 10 (i.e., the openings 105 are arrayed along x and y axes, respectively, of an x-y plane). In this case, each opening 105 is spaced apart from other openings 105 in each of x and y directions orthogonal to one another.

The openings 105 are formed by forming a mask on the mold structure 100 and, for example, anisotropically etching the mold structure 100 using the mask as an etch mask. However, in the case in which the mold structure 100 comprises two different kinds of layers (material having different etch rates), the sidewall surface delimiting the opening 105 may not be formed precisely vertical (perpendicular relative to the top surface of the substrate 10). Rather, the sidewall is more likely to be inclined, defining an opening 105 that tapers in the downward direction. Such a tapered opening 105 can cause the resulting three-dimensionally arranged transistors to have non-uniform operating characteristics. A detailed description of this non-uniformity and methods of improving the same, which may be employed herein, are disclosed in U.S. Patent Publication No. 2010/0078701 the contents of which are hereby incorporated by reference.

The openings 105 may be formed to expose the top surface of the substrate 10 as illustrated, especially when the mold structure 100 is formed directly on the substrate 10. In any case, the substrate 10 may be recessed due to over-etching of the mold structure 100.

Figure 3:
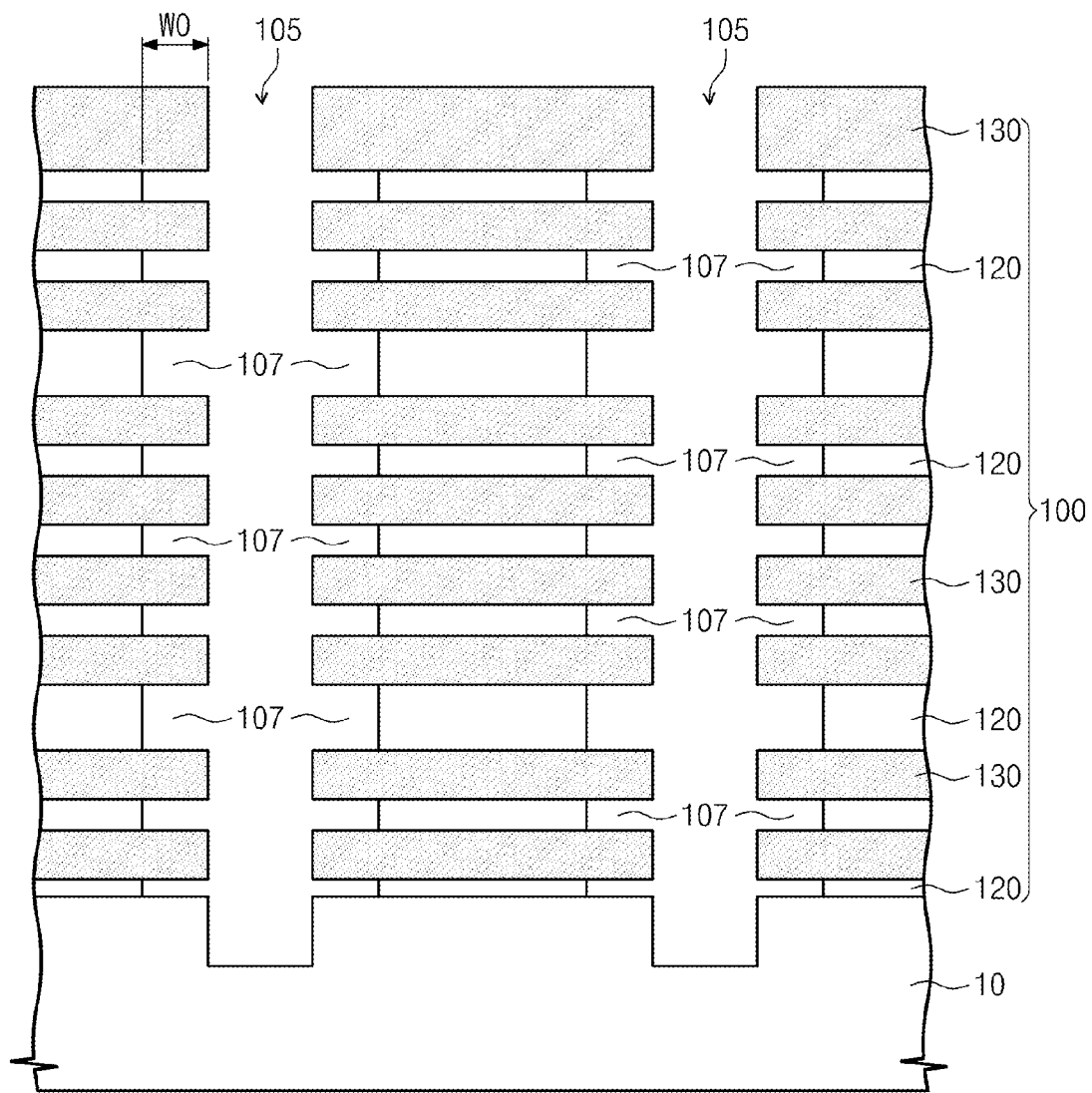

Referring to FIG. 3, the interlayer dielectrics 120 exposed by the openings 105 are etched. The resulting under-cut regions 107 define recesses extending horizontally from the openings 105. The depth W0 of the recesses defined by the under-cut regions 107 (dimension in the horizontal direction) is preferably less than one-third the distance between two adjacent openings 105 and greater than half the thickness of the thinnest of the interlayer dielectrics 120.

The etchant used to form under-cut regions 107 has an etch selectivity with respect to the sacrificial layers 130. For example, in the case in which the sacrificial layers 130 are formed of silicon nitride and the interlayer dielectrics 120 are formed of silicon oxide, the interlayer dielectrics 120 may be etched using an etching solution comprising hydrofluoric acid.

Figure 4:
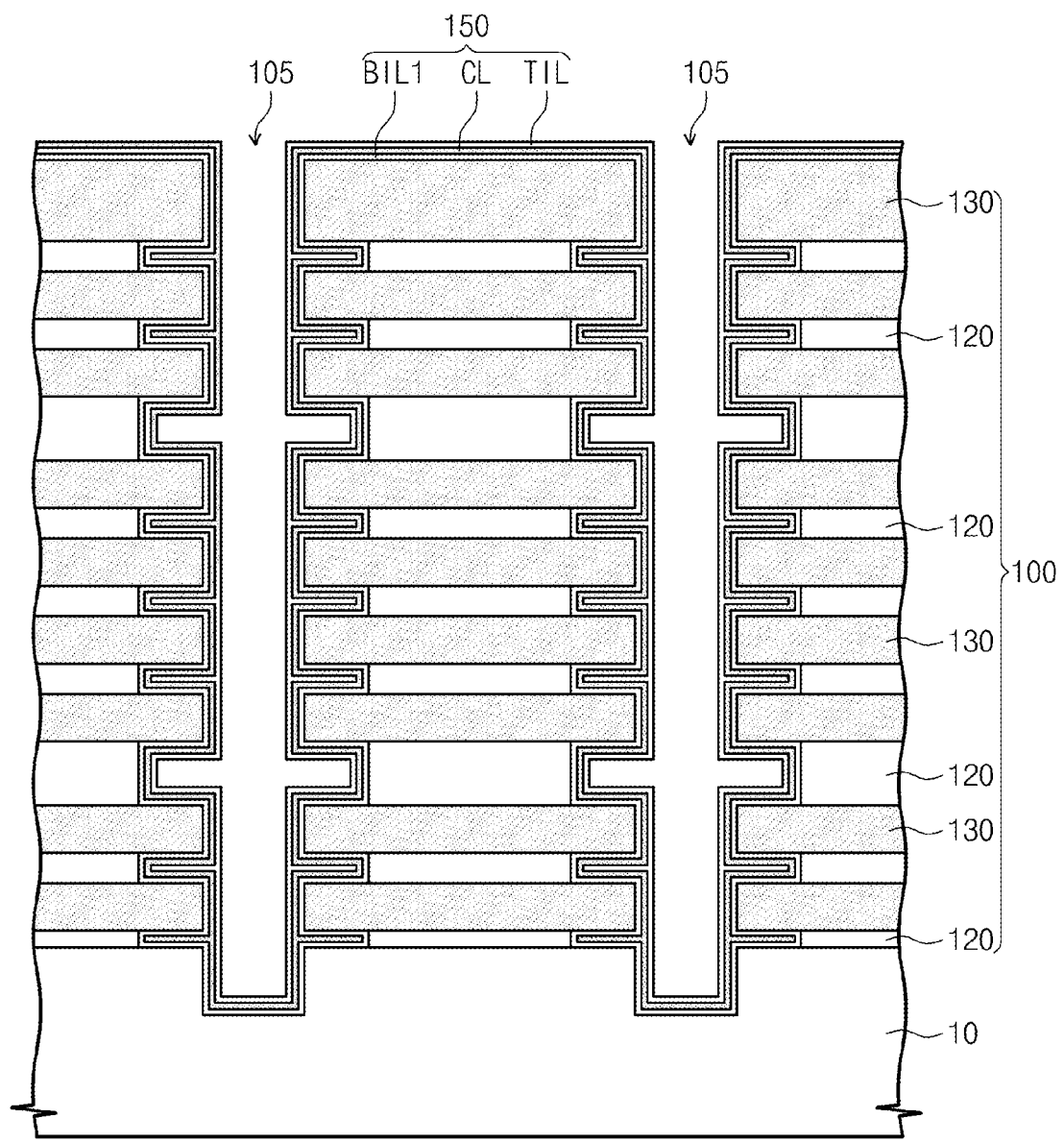

Referring to FIG. 4, a vertical covering 150 is formed in the opening 105. The vertical covering 150 may also extend horizontally from the openings 105 over the top surface of the mold structure 100. In this example, the vertical covering 150 includes a tunnel insulating layer TIL and a charge storing layer CL. Also, in this example, the charge storing layer CL is formed before the tunnel layer TIL.

The charge storing layer CL may comprise an insulating layer formed by a deposition process such as chemical vapor deposition (CVD) or atomic layer deposition (ALD). The charge storing layer CL may also have nano-particles such as conductive nanodots. Furthermore, the charge storing layer CL may constitute a trap insulating layer having rich charge trap sites or a floating gate electrode. With respect to specific material, the charge storing layer CL may include at least one of silicon nitride, silicon oxynitride, silicon-rich nitride, and nano-crystalline silicon. Thus, the charge storing layer CL may be a composite layer, e.g., a laminated trap layer.

The tunnel insulating layer TIL is of material having a greater bandgap than the charge storing layer CL, and may be formed by a deposition process such as CVD or ALD. In one example of the present embodiment, the tunnel insulating layer TIL is a silicon oxide layer, formed by one of the aforementioned deposition methods. In addition, the tunnel insulating layer TIL may be thermally treated. The thermal treatment, performed after the deposition process, may be a rapid thermal nitridation (RTN) process or an annealing process performed in an ambient containing at least one of nitrogen and oxygen.

In the example of this embodiment shown in FIG. 4, the covering layer 150 also includes a first blocking insulating layer BIL1. In this case, the first blocking insulating layer BIL1 is formed before the charge storing layer CL. The first blocking insulating layer BIL1 preferably has a greater band gap than the charge storing layer CL, e.g., the first blocking insulating layer BIL1 may be formed of a high-k dielectric, such as aluminum oxide or hafnium oxide, or silicon oxide. Also, the first blocking insulating layer BIL1 may be formed by a deposition process such as CVD or ALD.

Figure 13A:
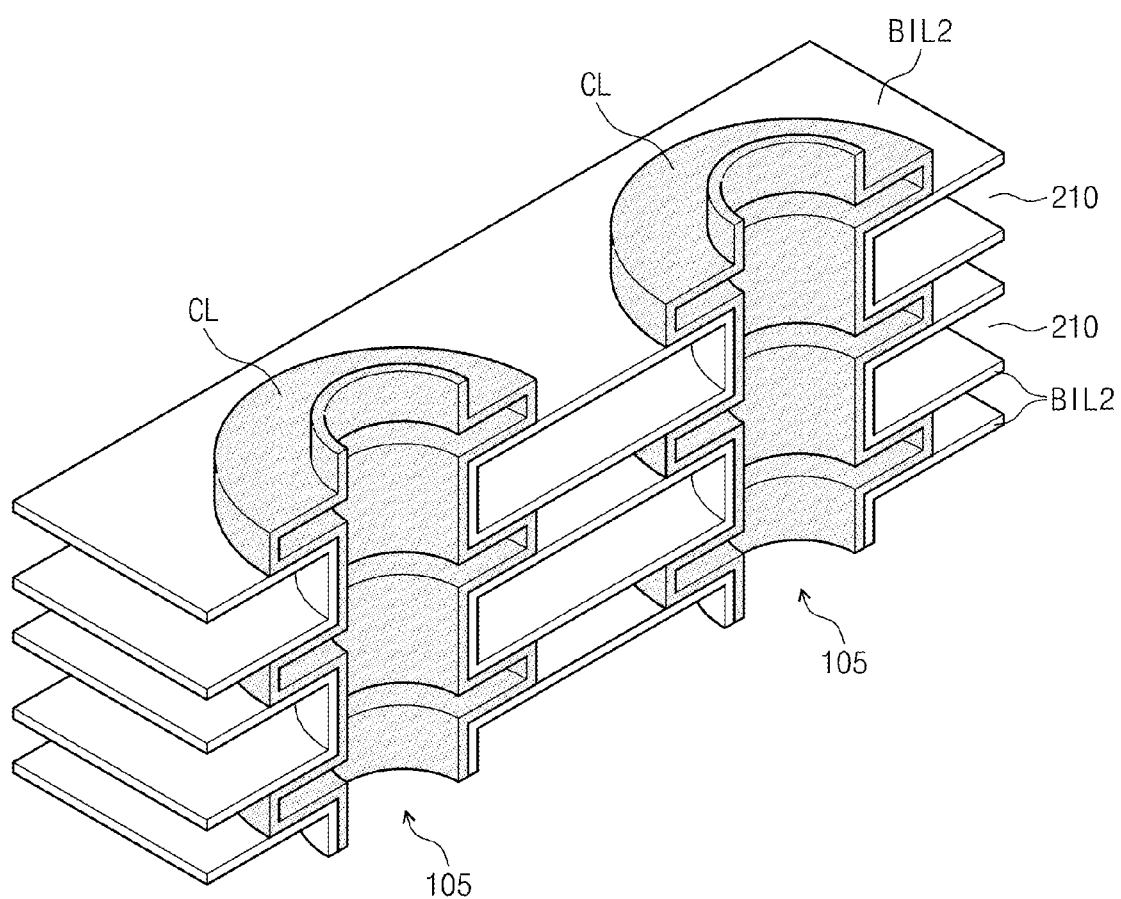
FIGS. 13A and 13B are perspective cut-away views of structure including a charge storing layer of a three-dimensional semiconductor device according to the inventive concept.
Figure 13B:
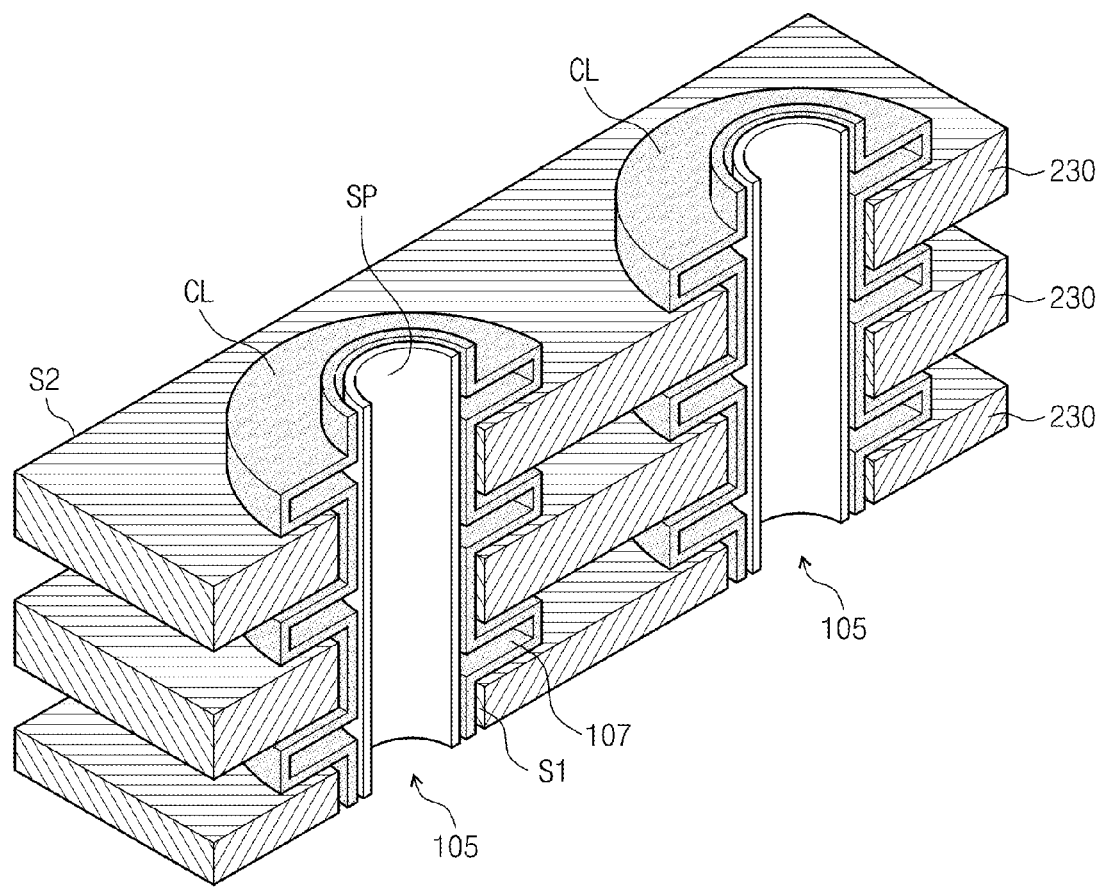

According to an aspect of the inventive concept, the charge storing layer CL extends horizontally from each opening 105 conformally over inner wall surfaces of the under-cut regions 107, e.g., over inner wall surfaces of the interlayer dielectrics 120 and sacrificial layers 130, or over inner wall surfaces of the first blocking insulating layer BIL1. FIGS. 13A and 13B show the former example in which the charge storing layer CL extends conformally over inner wall surfaces of the under-cut regions 107.

In any case, the under-cut regions 107 are not filled by the charge storing layer CL. In other words, in the case in which the charge storing layer CL is formed directly on the wall surfaces of the under-cut regions 107, the thickness of the charge storing layer CL is less than half the thickness (dimension in the vertical direction) of the thinnest under-cut region 107. In the case in which the first blocking insulating layer BIL1 is provided in the under-cut regions 107, the thickness of the charge storing layer CL is less than half the thickness of the remaining portion of the thinnest under-cut region 107, i.e., is less than half the thickness of that portion of the thinnest under-cut region 107 which is not occupied by the first blocking insulating layer BILL Accordingly, the length of the charge storing layer CL within an under-cut region 107 is greater than the distance between the adjacent sacrificial layers 130 of the undercut region 107. In other words, the length of the charge storing layer CL within an under-cut region 107 is greater than the thickness of the interlayer dielectric 120 within the under-cut region 107. As a result, the total length of that part of the charge storing layer CL which traverses an opening 105 from top to bottom is greater than the depth of the opening 105.

The tunnel insulating layer TIL may partially or completely fill (what remains of) the recesses defined by the under-cut regions 107. As described above, the recesses defined by the under-cut regions 107 are not filled by the charge storing layer CL. Thus, the tunnel insulating layer TIL can extend horizontally into the under-cut regions 107 to fill or partially fill what remains of the space not occupied by the charge storing layer CL.

Figure 5:
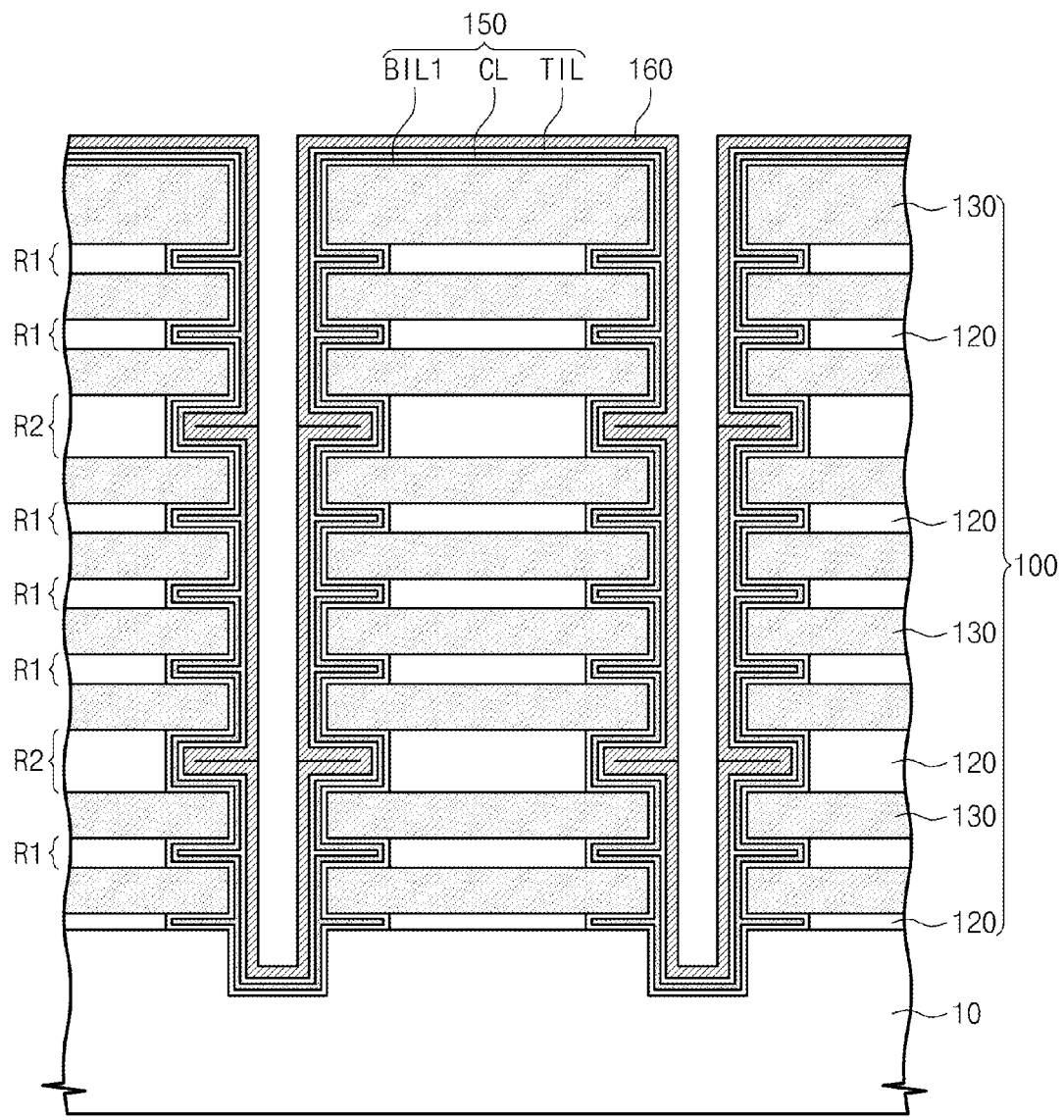

Referring to FIG. 5, a first semiconductor layer 160 is formed in the openings 105. The first semiconductor layer 160 may be formed of polysilicon or single-crystalline silicon, but the inventive concept is not limited thereto. For instance, the first semiconductor layer 160 may be an organic semiconductor layer or may be formed of a phase changeable material with a semiconductor property.

The first semiconductor layer 160 conforms to the covering 150. Thus, the first semiconductor layer 160 may partially or completely fill what remains of the recesses of the under-cut regions 107. For instance, at least one of the under-cut regions 107 is a relatively thin region (hereinafter designated as a first region R1) and at least one of the under-cut regions 107 (hereinafter designated as a second region R2) is a relatively thick region by virtue of having a thickness greater than that the first region R1. In the example shown in FIG. 5, each first region R1 is filled by the covering 150 and each second region R2 is filled by the covering 150 and first semiconductor layer 160 together. Other examples in which the under-cut regions 107 do not have the same thickness will be descried later on.

Figure 6:
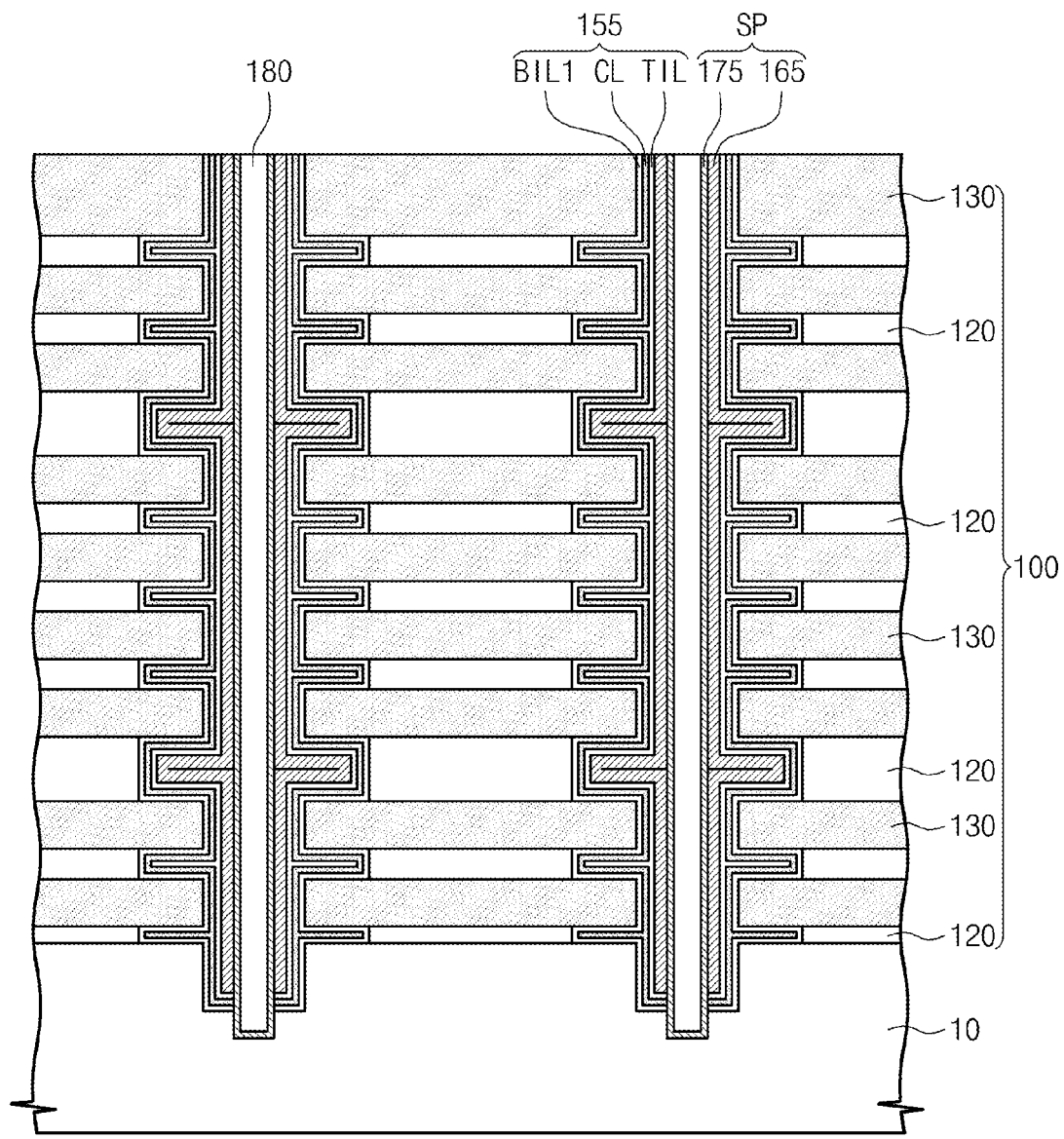

Referring to FIG. 6, the first semiconductor layer 160 and the covering 150 are patterned to expose the substrate 10, and a second semiconductor layer (not shown) is then formed in contact with the exposed substrate 10. Subsequently, an insulating gap-fill layer 180 is formed to fill (what remains of) the opening 105.

The second semiconductor layer may be formed using a CVD, ALD, or epitaxial process and may be a polysilicon layer or a single-crystalline silicon layer. Alternatively, the second semiconductor layer may be formed of an organic semiconductor layer. The insulating gap-fill layer 180 may be formed by a spin coating process or may be a silicon oxide layer formed by a deposition process. Also, in the illustrated example, the second semiconductor layer is conformally formed to such a thickness as to define a pin hole in the opening 105, and the insulating gap-fill layer 180 is formed to fill the pin hole.

The first semiconductor layer 160 and the covering 150 are patterned by anisotropically etching the first semiconductor layer 160 to expose a top surface of the covering 150 below the openings 105, and then etching the covering 150 to expose a top surface of the substrate 10. As a result, the covering 150 and the first semiconductor layer 160 are removed from a top surface of the mold structure 100 and from the bottom of the openings 105 to form a vertical pattern 155 and a first semiconductor pattern 165, respectively, which remain locally on the sides of the openings 105.

In some cases, an additional removal process may be performed to remove the second semiconductor layer from the top of the mold structure 100. In this case, as shown in FIG. 6, the second semiconductor layer forms a second semiconductor pattern 175 remaining locally in the opening 105. The additional removal process may be performed in a later stage of the fabrication process. In any case, the first and second semiconductor patterns 165 and 175 constitute a plurality of semiconductor patterns SP, which serve as pathways for transmitting electric signals to memory cells.

Figure 7:
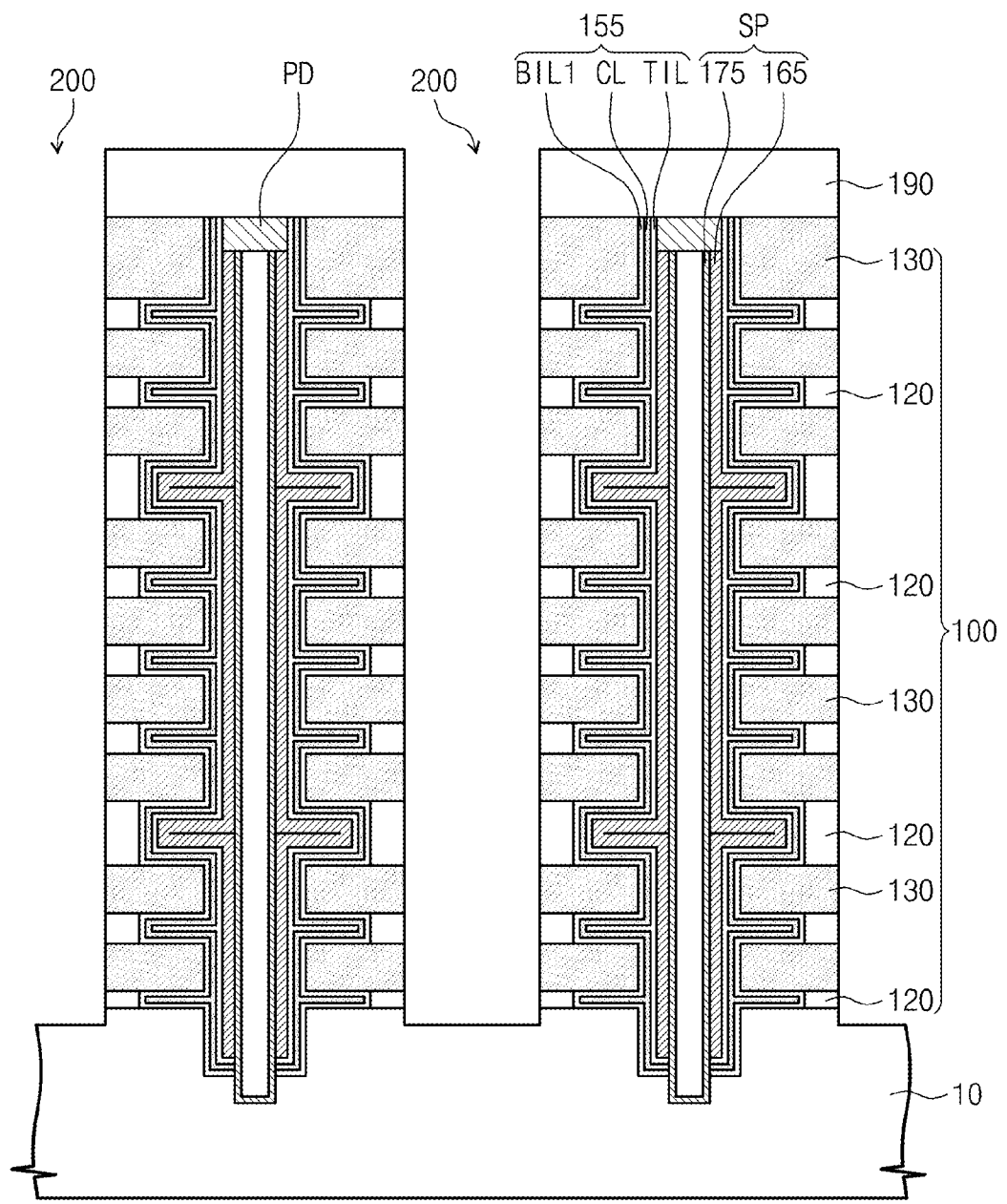

Referring to FIG. 7, trenches 200 are formed through the mold structure 100. The trenches 200 are spaced apart from and may cross the openings 105. In another example, trenches 200 are formed at both sides of each of the openings 105, respectively. However, the distance between two adjacent trenches 200 and/or the number or arrangement of the openings 105 interposed between each pair of trenches 200 may vary as desired. In this respect, the openings 105 and trenches 200 may be arranged as disclosed in the aforementioned U.S. Patent Publication No. 2011/0147801. In any case, as a result, sidewalls of the sacrificial layers 130 and the interlayer dielectrics 120 are exposed.

The trenches 200 may be formed by forming an etch mask 190 on the mold structure 100 and/or on the insulating gap-fill layer 180 and anisotropically etching layers below the etch mask 190 to, for example, expose the top surface of the substrate 10. The substrate 10 itself may be recessed by the over-etching of the layers below the etch mask.

Similar to the case of forming the openings 105, the trench 200 may be tapered as a result of the anisotropic etching of the sacrificial layers 130 and interlayer dielectrics 120. The tapered trench 200 may cause non-uniformity in operational characteristics of three-dimensionally arranged transistors. This drawback may be overcome using the technique disclosed in the aforementioned U.S. Patent Publication No. 2010/0078701.

As shown in FIG. 7, a pad PD may be formed on the semiconductor pattern SP before the etch-mask 190 is formed. The pad PD may be formed of a semiconductor material having a different conductivity type from the substrate 10. In some cases, the pad PD may be formed before the trench 200.

Figure 8:
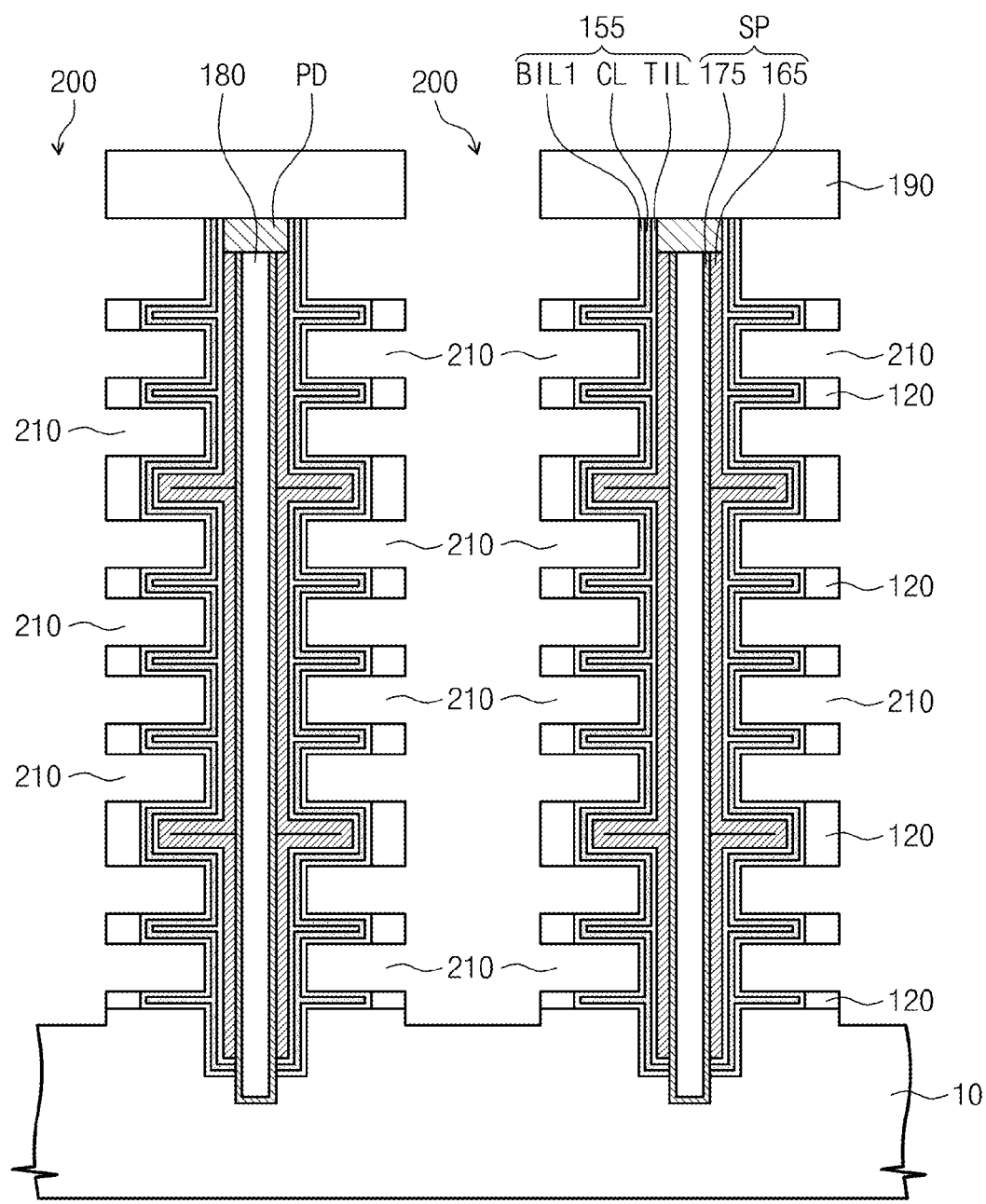

Referring to FIG. 8, the sacrificial layers 130 exposed by the trenches 200 are removed to form recesses 210 between the interlayer dielectrics 120. Each recess 210 extends horizontally from the trench 200 to expose a sidewall of the vertical pattern 155. Furthermore, each recess 210 may expose top and bottom surfaces of portions of the vertical pattern 155, which are disposed in the under-cut regions 107.

The recesses 210 are formed by etching the sacrificial layers 130 using an etch recipe having an etch selectivity with respect to the interlayer dielectrics 120 and the vertical patterns 155. For instance, in the case in which the sacrificial layers 130 are formed of silicon nitride and the interlayer dielectrics 120 are formed of silicon oxide, the etching may be performed with an etching solution containing phosphoric acid.

At this time, the first blocking insulating layer BIL1 may prevent the charge storing layer CL from being damaged. In that case, portions of the first blocking insulating layer BIL1 which are exposed by the recesses 210, may be removed by an additional process after the recesses 210 have been formed.

Figure 9:
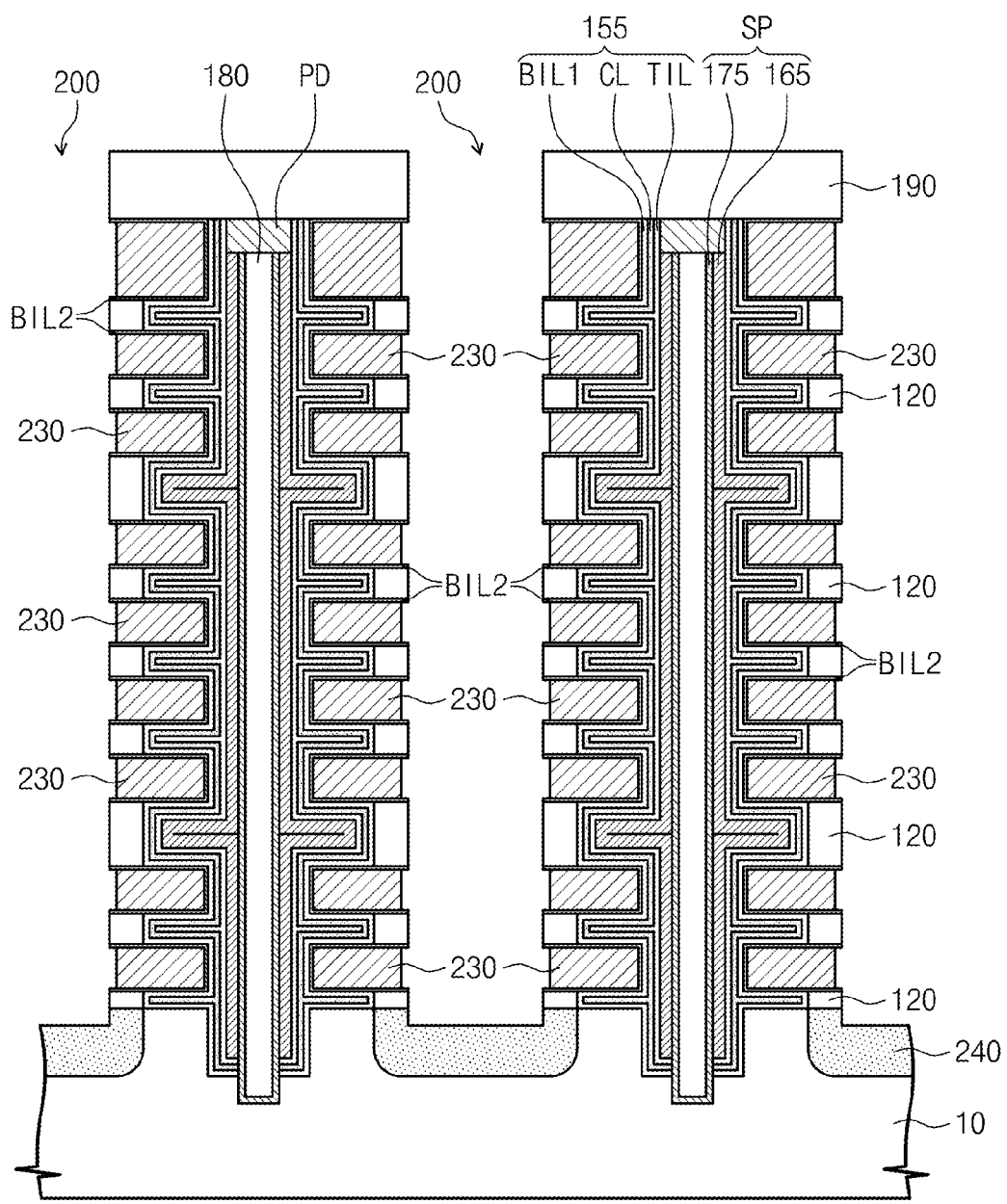

Referring to FIG. 9, a second blocking insulating layer BIL2 and conductive patterns 230 are formed to sequentially fill the recesses 210. The second blocking insulating layer BIL2 is formed conformally to cover inner walls that delimit the recesses 210, and the conductive patterns 230 fill the remaining space of the recesses 210. The conductive patterns 230 together constitute an electrode structure of the device.

The second blocking insulating layer BIL2 preferably has a greater band gap than the charge storing layer CL and may be formed by CVD or ALD. For instance, the second blocking insulating layer BIL2 may include a high-k dielectric such as aluminum oxide or hafnium oxide, or may be a silicon oxide layer.

The conductive patterns 230 are formed by filling the trenches completely or partially with conductive material, and then removing part of the conductive material from the trenches 200 such that part of the conductive material remains as the conductive patterns 230 in the recesses 210. The conductive material may include doped silicon, a metallic material, metal nitride, and/or a metal silicide. For example, the conductive material may include a tantalum nitride layer and/or a tungsten layer. In one example of this part of the method, the conductive material is formed conformally over the inner walls of the structure on which the second blocking insulating layer BIL2 has been formed, and the resulting conformal conductive layer in the trench 200 is isotropically etched. In other example, the conductive material is formed to fill the trench 200, and the resulting plug of conductive material is isotropically and/or anisotropically etched.

Also, as a result, each of the charge storing layers CL becomes interposed between a respective one of the semiconductor patterns SP and the electrode structure constituted by the conductive patterns 230.

Next, doped regions 240 may be formed in the substrate 10 exposed by the trench 200. The doped regions 240 may be formed by an ion implantation process. In this example, the doped regions 240 are of a different conductivity type than the substrate 10. Also, the semiconductor pattern SP may be the same conductivity type as the substrate 10 or may be an intrinsic semiconductor.

In some cases, the doped regions 240 are connected to each other so as to be in an equipotential state. In other cases, the doped regions 240 may be electrically isolated from each other and at different electric potentials. In still other cases, the doped regions 240 may constitute a plurality of source groups including at least one doped region, and in which the source groups are electrically isolated from each other and are at different electric potentials.

Figure 10:
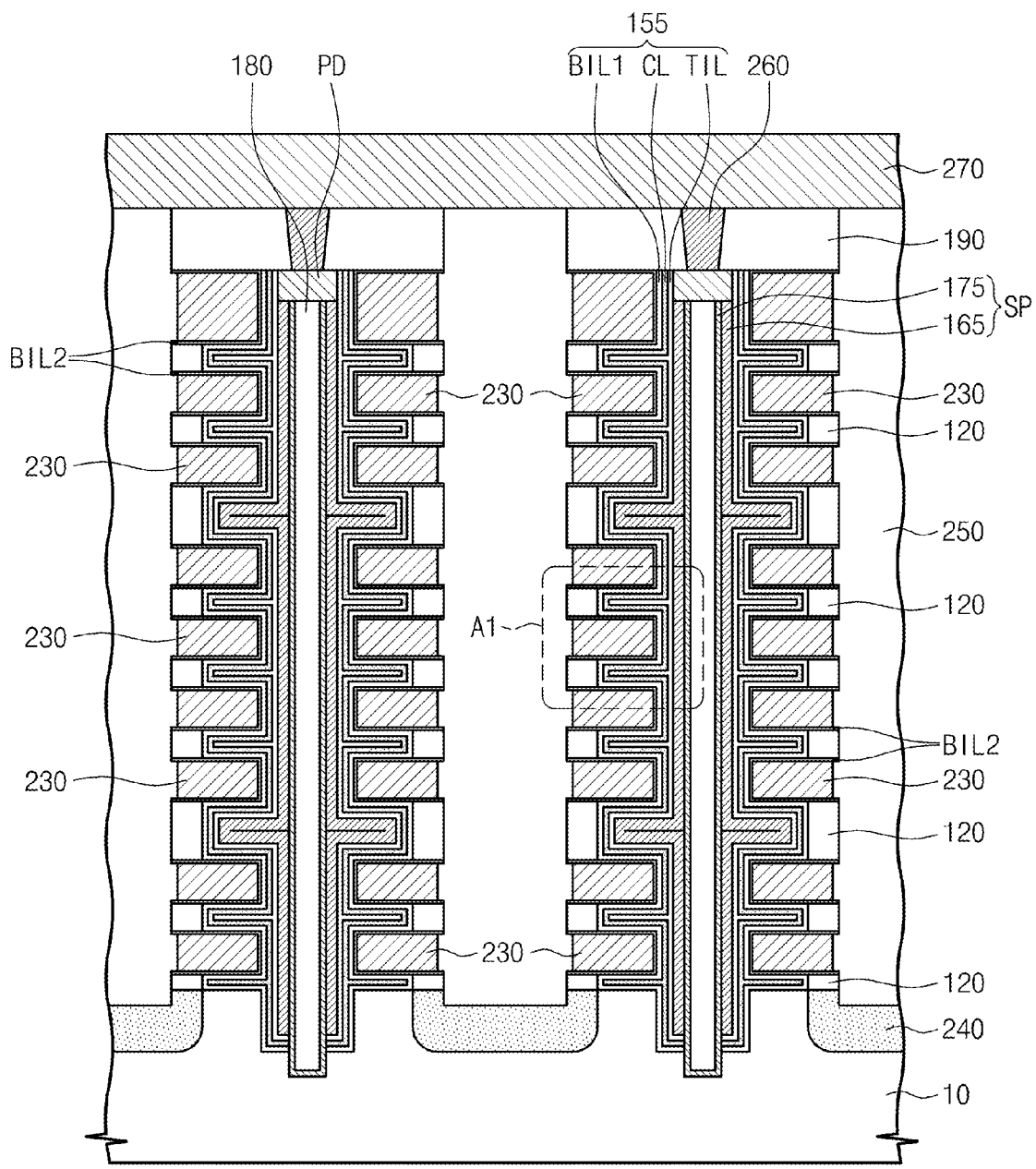

Referring to FIG. 10, an electrode separation pattern 250 is formed to fill the trenches 200. The electrode separation pattern 250 may be formed by forming an electrode separation layer (not shown) to such a thickness as to overfill the trenches, and etching the structure including the electrode separation layer to expose a top surface of the etch-mask 190 or the pad PD. The electrode separation layer may be formed of at least one of silicon oxide, silicon nitride and silicon oxynitride. The structure including the electrode separation layer may be etched using a planarization technique, e.g., chemical-mechanical polishing and/or an etch-back process.

Subsequently, upper plugs 260 are formed on the pads PD, respectively, and upper interconnection lines 270 are formed on the upper plugs 260 to connect the upper plugs 260 with each other. Each of the upper interconnection lines 270 may be electrically connected to the first semiconductor pattern 165 and the second semiconductor pattern 175 via the upper plug 260 and/or the pad PD and be formed to cross the conductive patterns 230. In an example of this embodiment as applied to the fabrication of a flash memory, the upper interconnection lines 270 are bit lines connected to upper end portions of a plurality of cell strings.

[A Structure of a 3D Semiconductor Device]

Figure 11A:
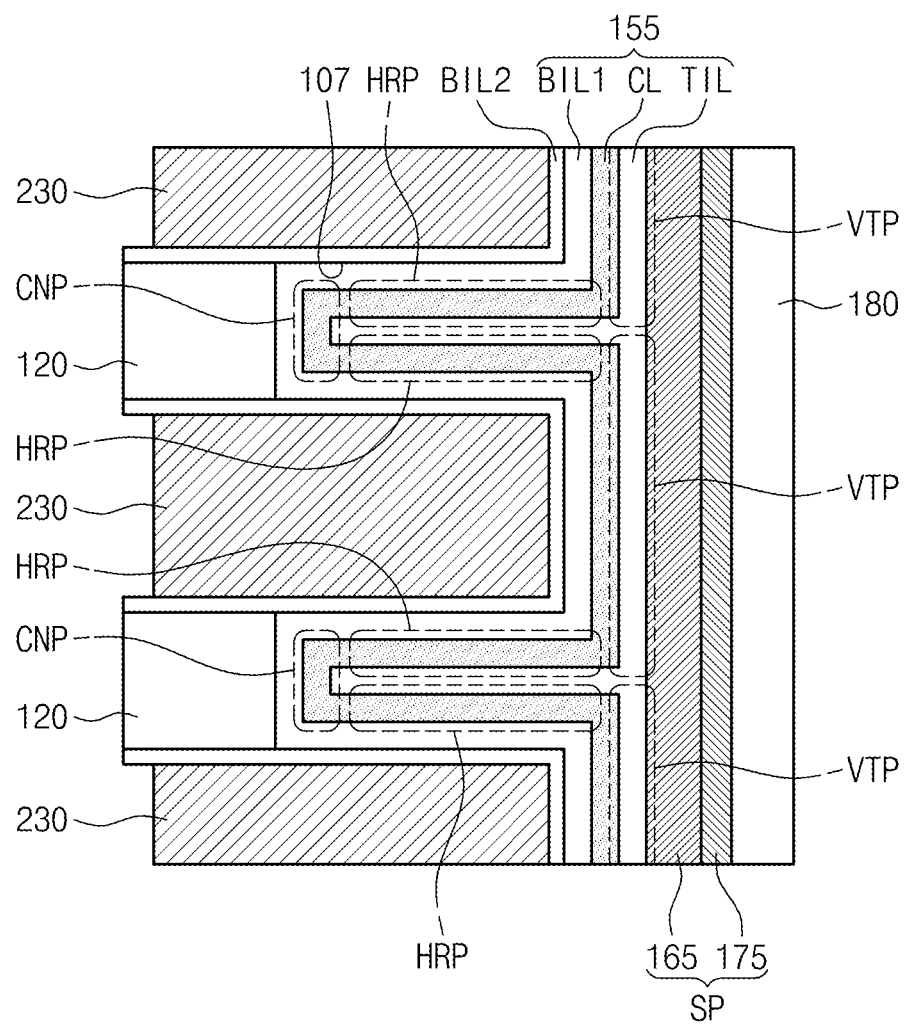
FIG. 11A is enlarged view of the encircled part A1 of the three-dimensional semiconductor device shown in FIG. 10, according to the inventive concept.

FIG. 11A shows an example of the charge storing layer CL which has vertical portions VTP, horizontal portions HRP (substantially planar segments oriented in the horizontal direction), and connecting portions CNP. The vertical portions VTP are disposed along the sides of the opening 105. Each of the horizontal portions HRP extends horizontally from the vertical portion VTP into the under-cut region 107, and each of the connecting portions CNP is disposed in the respective under-cut region 107 to connect horizontal portions HRP therein with each other. More specifically, horizontal portions HRP extend from respective vertical portions VTP into each under-cut region 107, and are connected with each other by a connecting portion CNP.

Figure 11B:
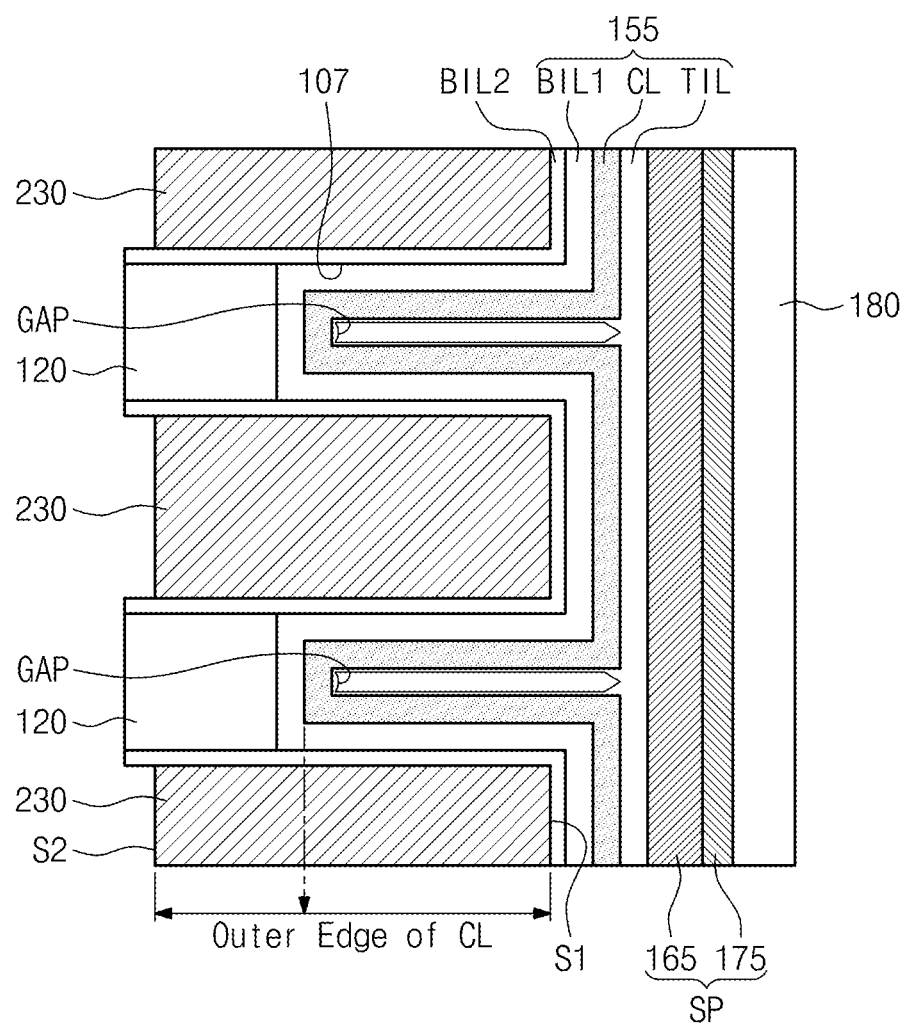
FIG. 11B is a similar enlarged view of part of another example of a three-dimensional semiconductor device according to the inventive concept.

Furthermore, as shown in FIG. 11B, the outer peripheral edge of the charge storing layer CL is located between a first sidewall S1 and a second sidewall S2 of the conductive pattern 230 in the horizontal direction. Note, the first sidewall S1 faces towards but is spaced apart from the semiconductor pattern SP, respectively.

In this example also, the horizontal portions HRP of each respective pair thereof are connected only via the connecting portion CNR. That is, the horizontal portions HRP (and the vertical portions VTP, as well) are vertically separated from each other. This vertical separation can suppress technical problems caused by a charge spreading phenomena. Furthermore, by virtue of the connected horizontal portions HRP, the charge storing layer CL has a relatively great length. As a result, it is possible to effectively prevent technical problems related to the charge spreading phenomena.

Figure 12:
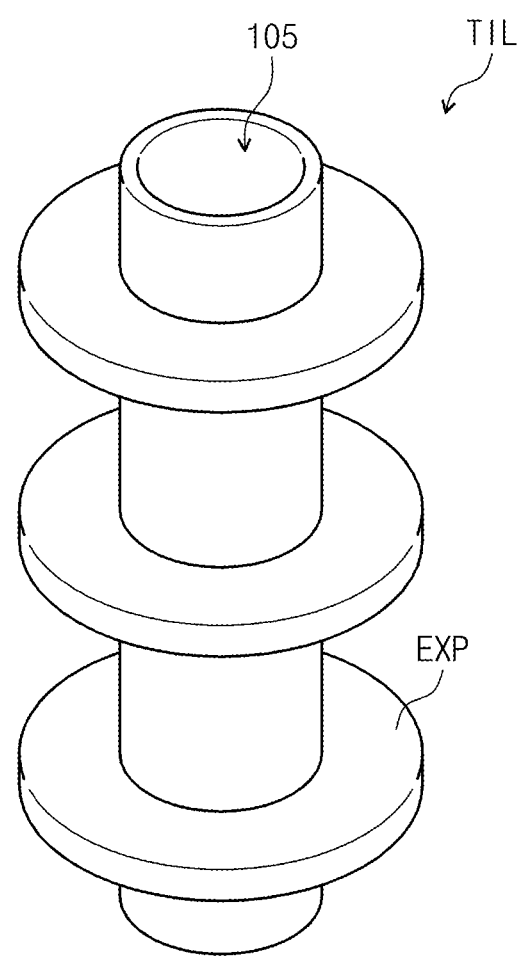
FIG. 12 is a perspective view of a tunnel insulating layer of a three-dimensional semiconductor device according to the inventive concept.

As shown in FIG. 11A, the space between the horizontal portions HRP is filled with the tunnel insulating layer TIL. For example, as shown in FIG. 12, the tunnel insulating layer TIL has extensions EXP that extend horizontally (radially) from the opening 105 into the space between horizontal portions HRP of the charge storing layer CL. Thus, the inner sidewall surface of the tunnel insulating layer TIL may conform to the outer sidewall surface of the semiconductor pattern SP and the outer sidewall surface of the tunnel insulating layer TIL may conform to the inner sidewall surface of the charge storing layer CL.

In another example of the 3D semiconductor memory device according to the inventive concept, the space between the horizontal portions HRP is only partially filled by the tunnel layer TIL. For instance, as shown in FIG. 11B, a gap GAP may be formed between the horizontal portions HRP. The gap GAP may be occupied by a medium having a lower dielectric constant than silicon oxide, such as air or a low-k dielectric, or a vacuum may exist in the gap. In this case, it is possible to effectively improve electrical disturbance characteristics between the vertical portions VTP. Here, the electrical disturbance refers to a phenomenon, in which electric charges stored in one of the vertical portions VTP electrically affect an adjacent vertical portion VTP or an adjacent portion of the semiconductor pattern SP.

FIGS. 13A and 13B show characteristics of the device in that charge storing layers CL may be locally disposed in the openings 105, respectively, and a plurality of the semiconductor patterns SP penetrate each second blocking insulating layer BIL2. Furthermore, the blocking insulating layer BIL2 is made up of a plurality of patterns each disposed in a respective layer of the device and surrounding the semiconductor patterns SP in the respective layer. Also, each of the second blocking insulating layers BIL2 may intersect a plurality of the charge storing layers CL and a plurality of the semiconductor patterns SP arrayed horizontally on the substrate 10. According to another characteristic of the device, shown in FIGS. 13A and 13B, each of the charge storing layers CL and each of the semiconductor patterns SP vertically penetrate a stack of the second blocking insulating layers BIL2.

Second Example

Figure 14:
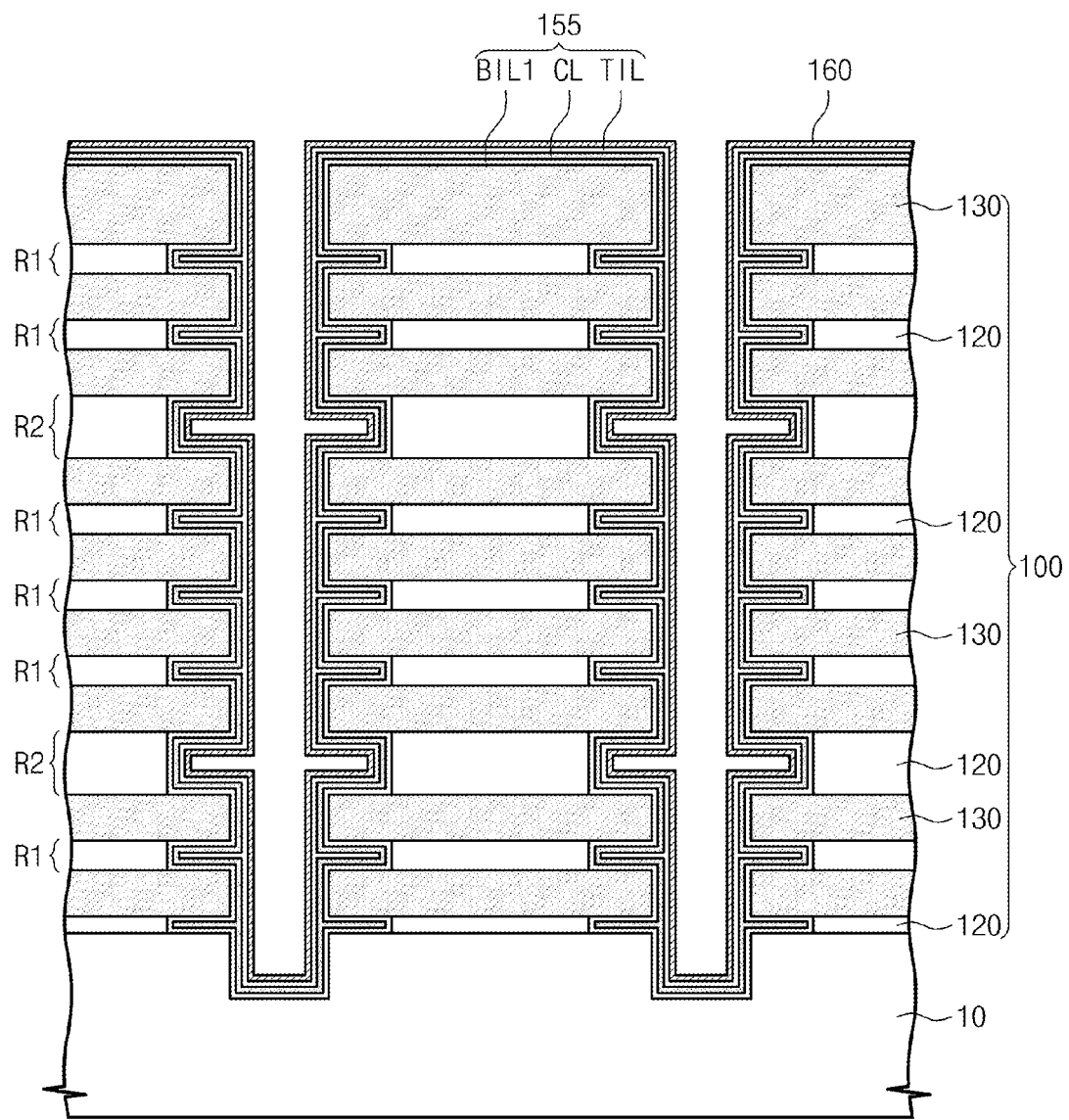
FIGS. 14 and 15 are sectional views illustrating steps in another example of a method of fabricating a three-dimensional semiconductor device according to the inventive concepts.
Figure 15:
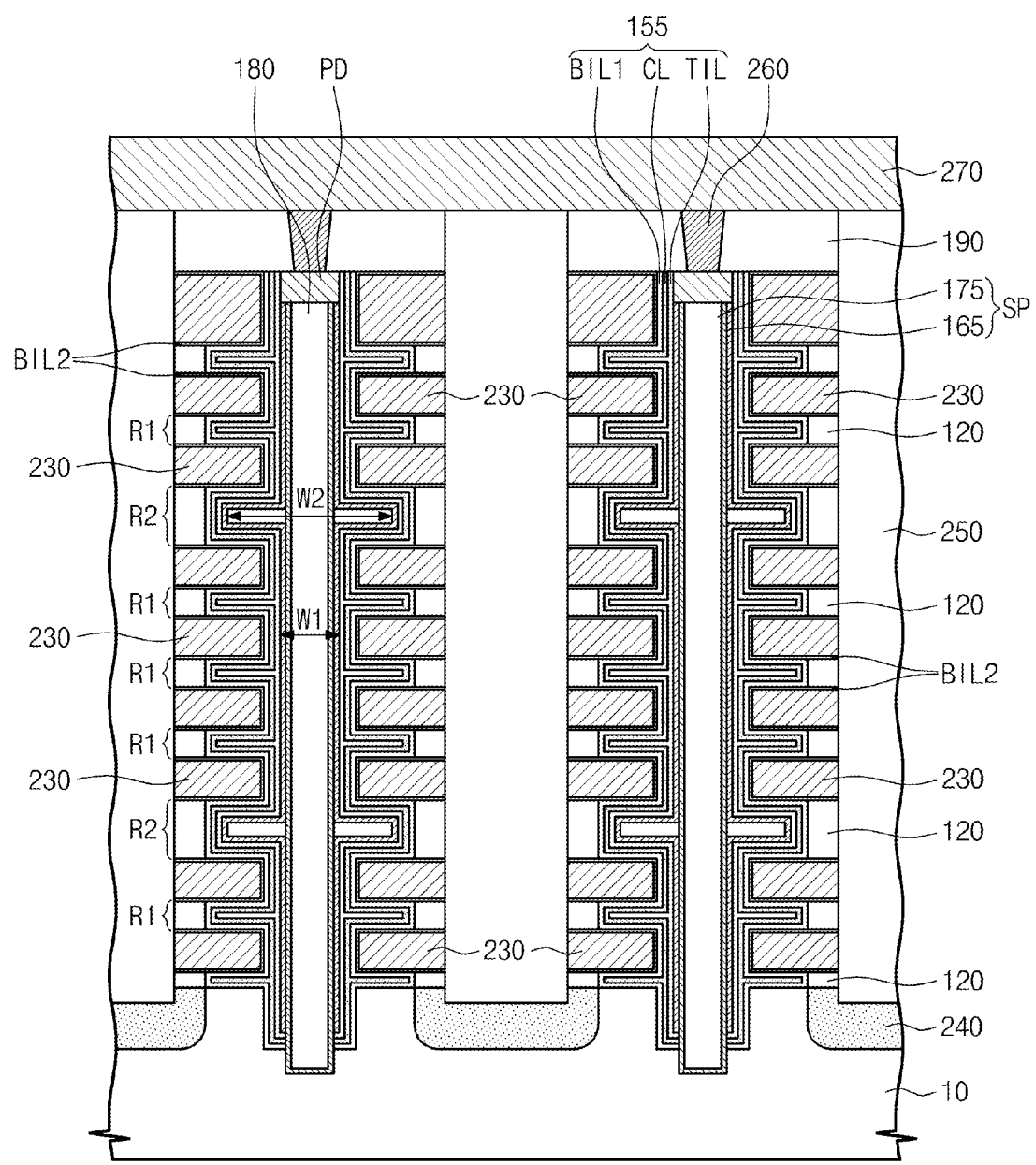

FIGS. 14 and 15 illustrate steps in the fabricating of another example of a 3D semiconductor device according to the inventive concept. For the sake of brevity, the elements and features of this example that are similar to those previously shown and described will not be described in much further detail.

In this example, the first regions R1 are partially or completely filled with the covering 150, and thus the first semiconductor layer 160 is not be formed in the first regions R1. By contrast, the second thicker regions R2 are filled with the vertical layer 150 as well as the first semiconductor layer 160. As a result, as shown in FIG. 15, a width W2 of the semiconductor pattern SP in the second region R2 is greater than a width W1 of the same semiconductor pattern SP in the first region R1.

Furthermore, in this example, the first semiconductor layer 160 does not completely fill the second region R2, as shown in FIG. 14. In other words, the thickness of the first semiconductor layer 160 (deposition thickness) is smaller than half the thickness of the unfilled portion of the under-cut region 107. Subsequently, as shown in FIG. 15, the second semiconductor pattern 175 is formed so as to not extend into those under-cut regions 107 which are not filled by the first semiconductor layer 160. That is, a gap is left in the second regions R2. The gaps may be filled with a medium having a dielectric constant lower than that of silicon oxide, such as air or a low-k dielectric, or may be in the state of a vacuum.

During an operation of semiconductor device, an electric current passing the second region R2 can flow via a geodesic path provided by the second semiconductor pattern 175, not a roundabout path provided by the first semiconductor pattern 165. As a result, it is possible to maximize electric current through the semiconductor pattern SP or keep resistance of the semiconductor pattern SP to a minimum.

Third Example

Figure 16:
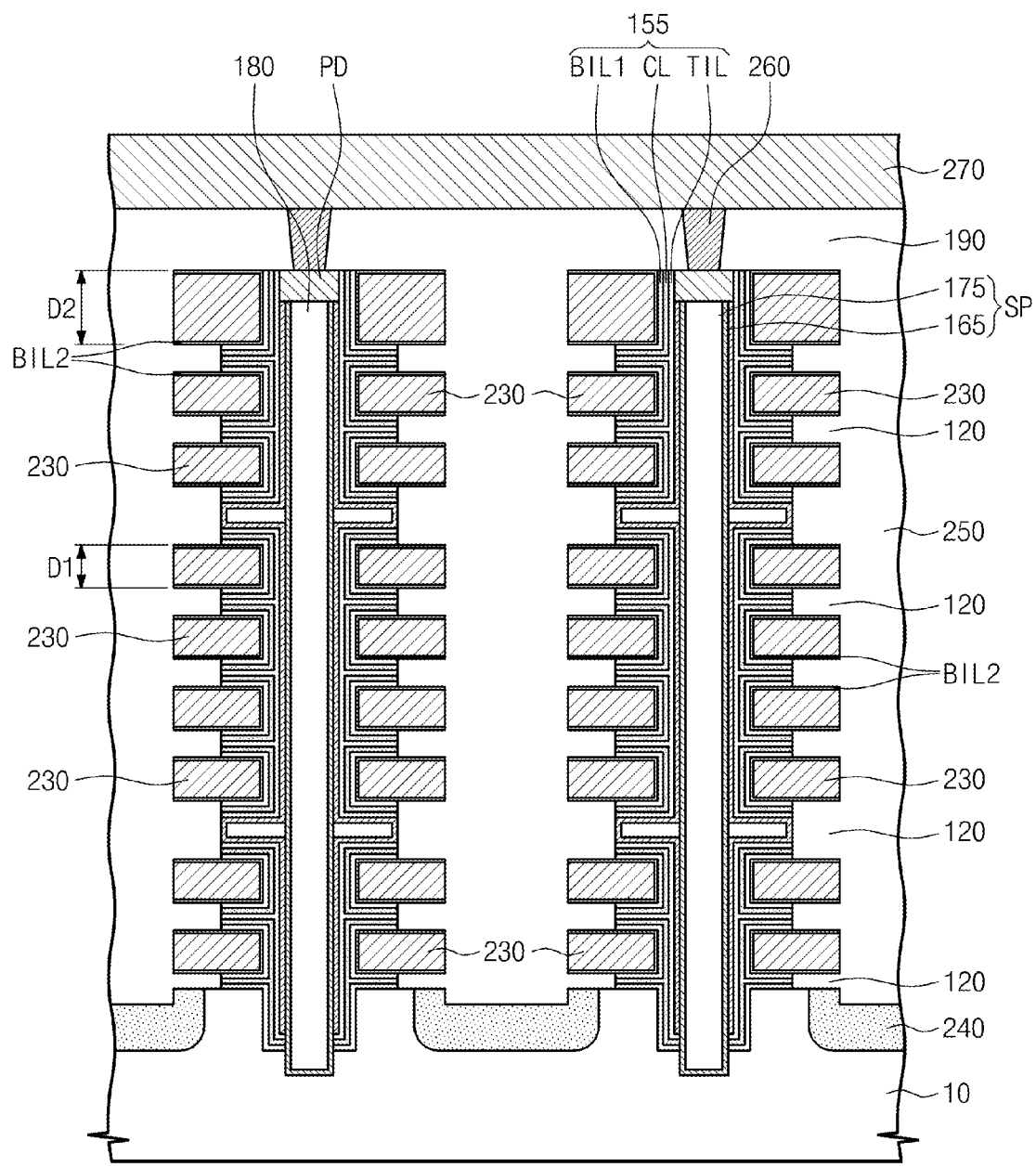
FIG. 16 is a sectional view illustrating a step in still another example of a method of fabricating a three-dimensional semiconductor device according to the inventive concept.

FIG. 16 illustrates a step in another example of the fabricating of a 3D semiconductor device according to the inventive concept. For the sake of brevity, again, the elements and features of this example that are similar to those previously shown and described will not be described in much further detail.

In this example, remaining portions of the interlayer dielectrics 120, which are used as a mold for forming the conductive patterns 230, are removed before the electrode separation pattern 250 is formed. In this case, as shown in FIG. 16, the electrode separation pattern 250 fills the spaces formed by the removal of the interlayer dielectrics 120.

In another version of this example, the electrode separation pattern 250 only fills part of the spaces formed by the removal of the interlayer dielectric 120. The remaining portions of the spaces may be filled with medium having a dielectric constant lower than that of silicon oxide, such as air or a low-k dielectric, or may be formed so as to be in the state of a vacuum.

Also, the first blocking insulating layer BIL1 or both the first blocking insulating layer BIL1 and the charge storing layer CL may be etched during the removing of the remaining portions of the interlayer dielectrics 120. For instance, as shown in FIG. 16, the charge storing layer CL is etched so as to have discrete vertically spaced apart portions. In other words, the charge storing layer CL may be formed without the connecting portions CNP described with reference to FIG. 11A.

Fourth Example

FIGS. 17 through 20 illustrate steps in the fabricating of still another example of a 3D semiconductor device according to the inventive concept. As has been the case, the elements and features of this example that are similar to those previously shown and described will not be described in much further detail for the sake of brevity.

Figure 17:
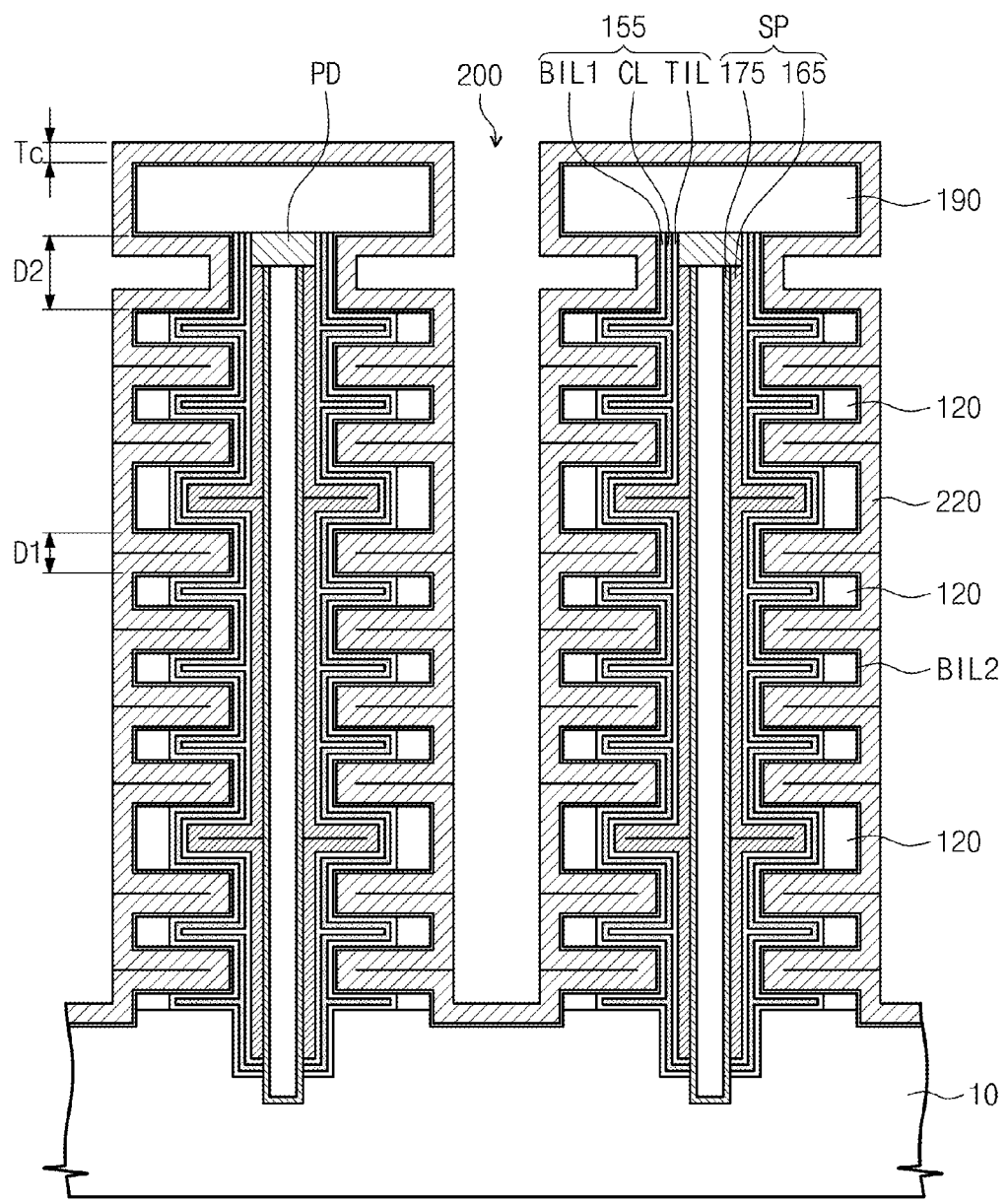
FIGS. 17 through 20 are sectional views illustrating steps in yet another example of a method of fabricating a three-dimensional semiconductor device according to the inventive concept.

The conductive pattern 230 is formed by forming a conformal conductive layer 220 to fill the recesses 210, as shown in FIG. 17. In this example, one or more (e.g., the uppermost) of the sacrificial layers 130 may be thicker than the others like the case shown in FIG. 1. Therefore, some of the recesses 210 may be formed to a depth D1 (in the vertical direction), while others may be formed to a depth D2 which is greater than the depth D1.

As is also shown in FIG. 17, a thickness Tc of the conductive layer 220 is greater than half the depth D1 and smaller than half the depth D2, i.e., D1/2<Tc<D2/2. In this case, the recesses 210 having the depth D1 (hereinafter referred to as "shallow recesses") are filled by the conductive layer 220, while the recesses 210 having the depth D2 (hereinafter referred to as "deep recesses") are not filled completely by the conductive layer 220.

Figure 18:
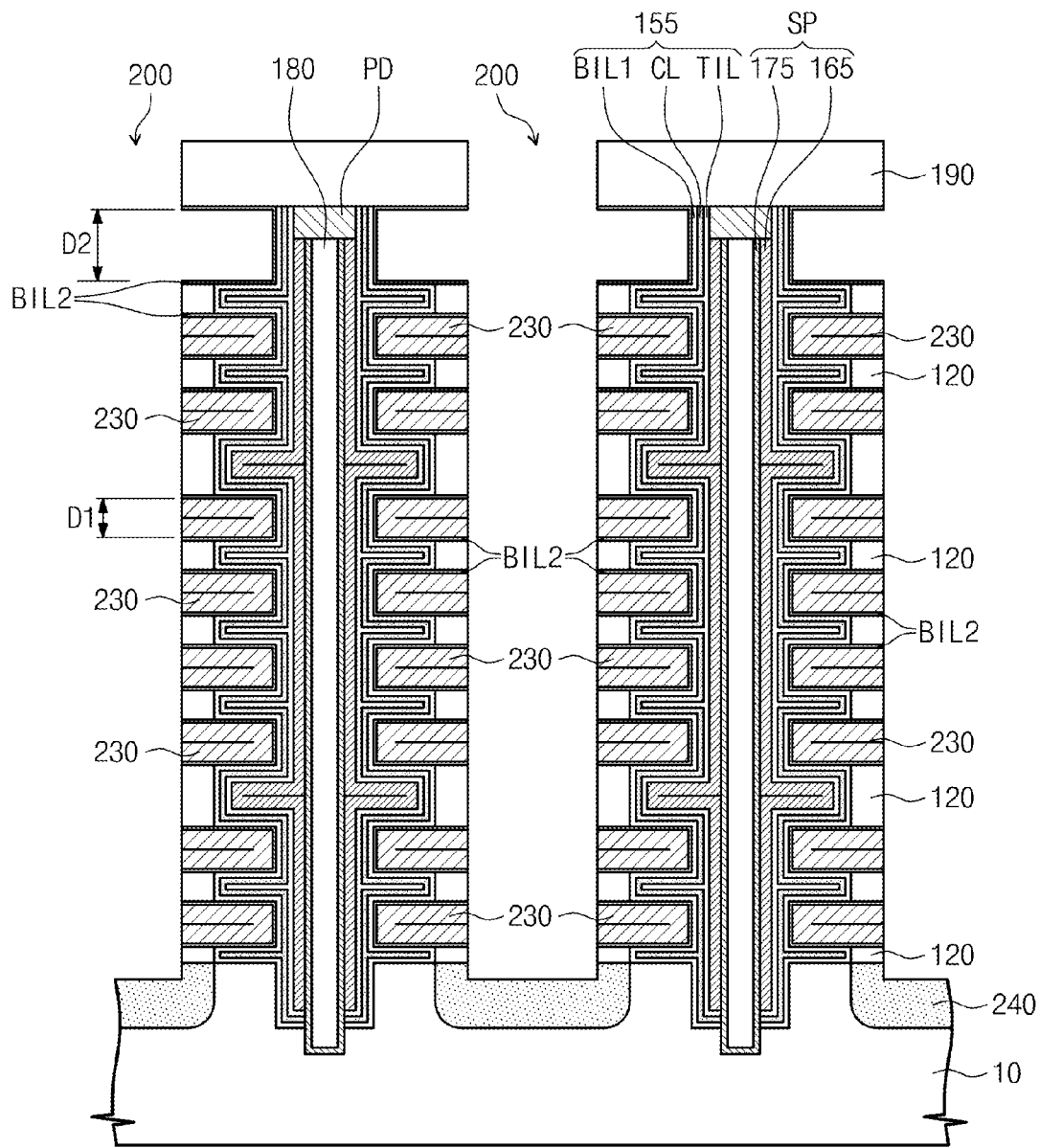

Next, as shown in FIG. 18, the conductive layer 220 is isotropically etched to form the conductive patterns 230 in the shallow recesses 210. During this step, the conductive layer 220 may be etched by an amount greater than the deposition thickness Tc of the conductive layer 220. Accordingly, the conductive layer 220 is be removed from the deep recess(es) 210 to expose the second blocking insulating layer BIL2. In some cases, the second blocking insulating layer BIL2 may also be removed from the deep recess(es) 210 to partially expose a surface of the vertical pattern 155.

Figure 19:
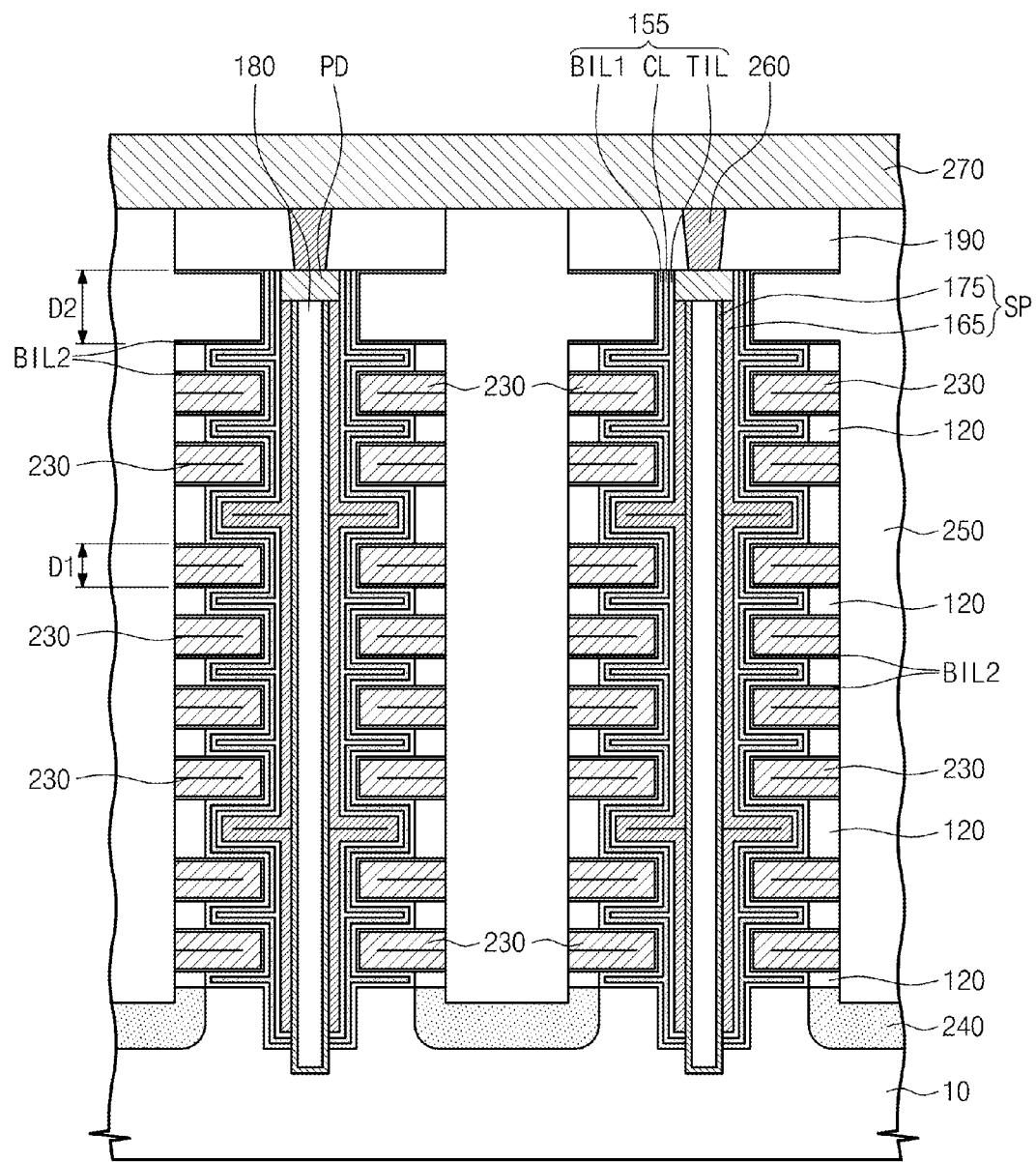

Referring to FIG. 19, the deep recess(es) 210, from which the conductive layer 220 has been removed, is filled with the electrode separation pattern 250. In other words, the conductive pattern 230 may be removed from regions around the pad PD or on the semiconductor pattern SP. In some cases, the pad PD may be disposed closer to the uppermost layer of the remaining conductive patterns 230, compared with the configuration shown in FIG. 19. For instance, the bottom surface of the pad PD may be positioned at a level lower than the top surface of the uppermost layer of the remaining conductive patterns 230.

Figure 20:
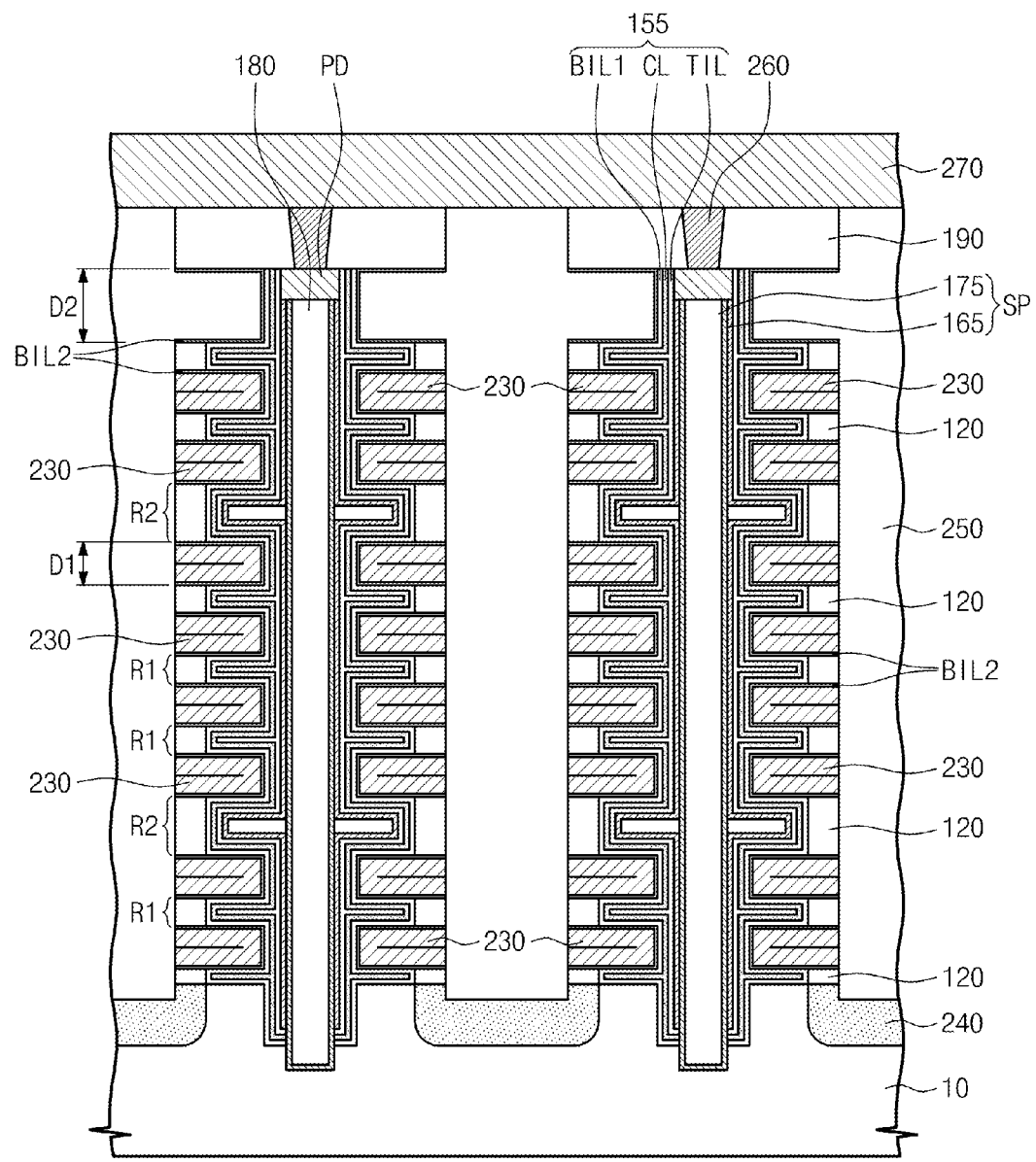

FIG. 20 is a sectional view of a 3D semiconductor memory device, which may be fabricated similarly to that described with reference to FIGS. 17 through 19. As shown in FIG. 20, the first semiconductor pattern 165 is formed to partially fill the second regions R2 and the conductive pattern 230 is not be formed around the pad PD.

Fifth Example

Figure 21:
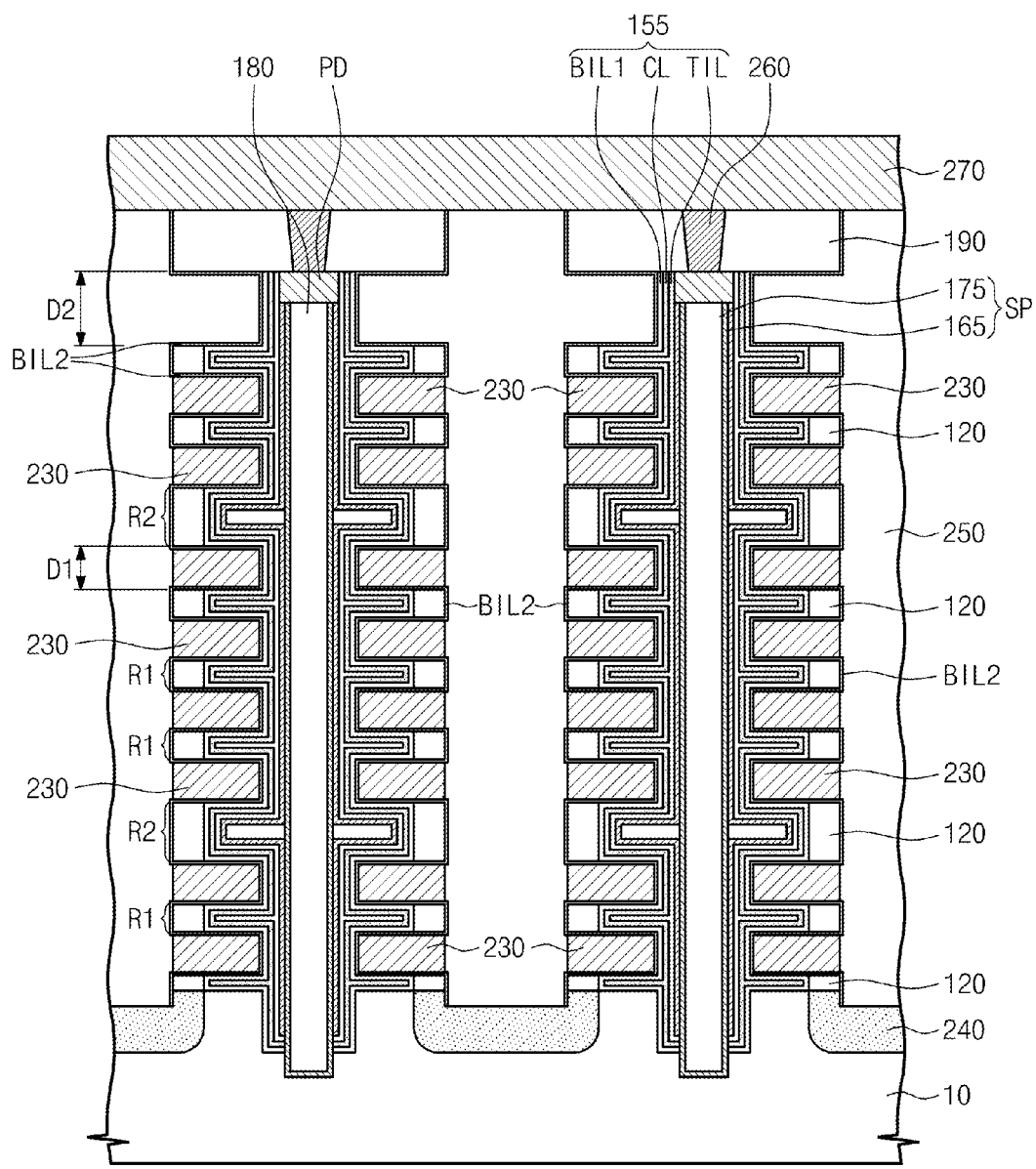
FIG. 21 is a sectional view of still another example of a three-dimensional semiconductor device according to the inventive concept.

FIG. 21 illustrates a step in still another example of the fabricating of a 3D semiconductor device according to the inventive concept. For the sake of brevity, again, the elements and features of this example that are similar to those previously shown and described will not be described in much further detail.

As described with reference to FIGS. 17 and 18, the conductive layer 220 is etched by an amount greater than the deposition thickness Tc of the conductive layer 220. In this case, sidewalls of the second blocking insulating layer BIL2, which cover sidewalls of the interlayer dielectrics 120, are left between the conductive patterns 230.

Figure 22:
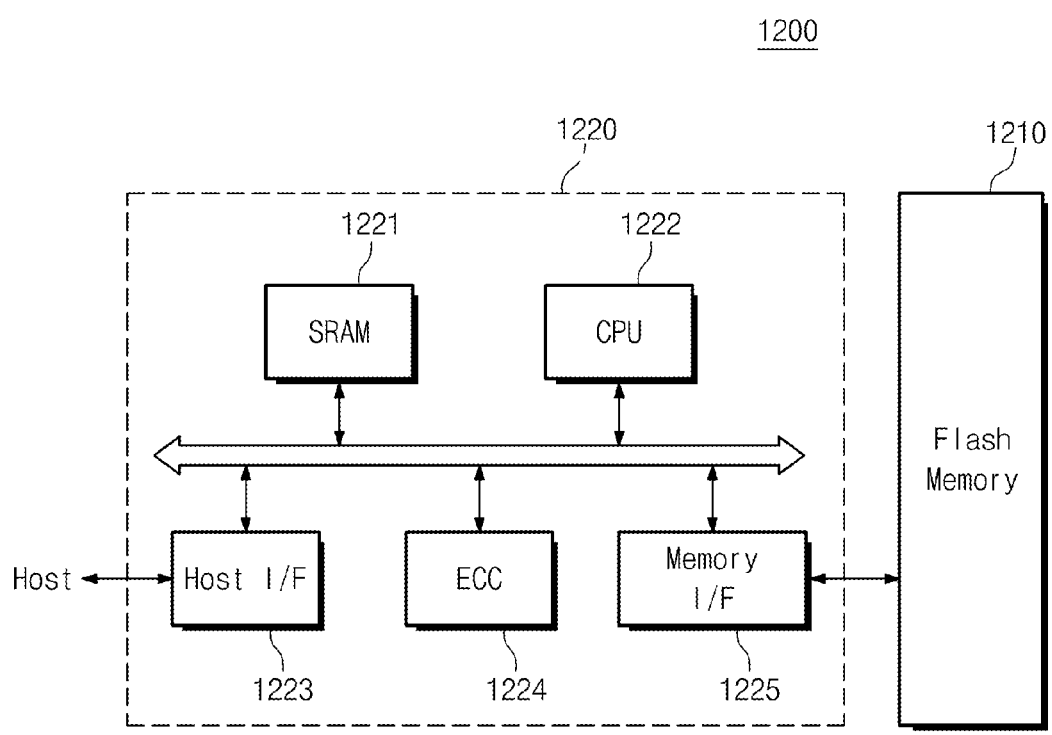
FIG. 22 is a block diagram of a memory card including a semiconductor memory device according the inventive concept.

FIG. 22 illustrates an embodiment of a memory card 1200 having a high data storage capacity. The memory card 1200 includes a 3D semiconductor memory device 1210, according to the inventive concept, and a memory controller 1220 controlling general data exchanges between a host and the semiconductor memory device 1210.

The memory controller 1220 may include a processing unit 1222, an SRAM 1221 as an operating memory of the processing unit 1222, a host interface 1223 providing the data exchange protocol of a host connected to a memory card 1200, an error correction block 1224 for detecting and correcting errors included in data read from a multi-bit semiconductor memory device 1210, and a memory interface 1225 that interfaces with the semiconductor memory device 1210. The processing unit 1222 may perform general control operations for data exchange of the memory controller 1220. Although (not shown) in the drawing, it will be apparent to those skilled in the art that the memory card 1200 may also include a ROM (not shown) storing code data to interface with a host.

The semiconductor memory device 1210 according to the inventive concept may be used to realize a highly reliable memory card or other memory systems having a configuration similar to that described above. In particular, the semiconductor memory device according to the inventive concept may constitute a memory system of the latest actively developed solid state drives (SSD).

Figure 23:
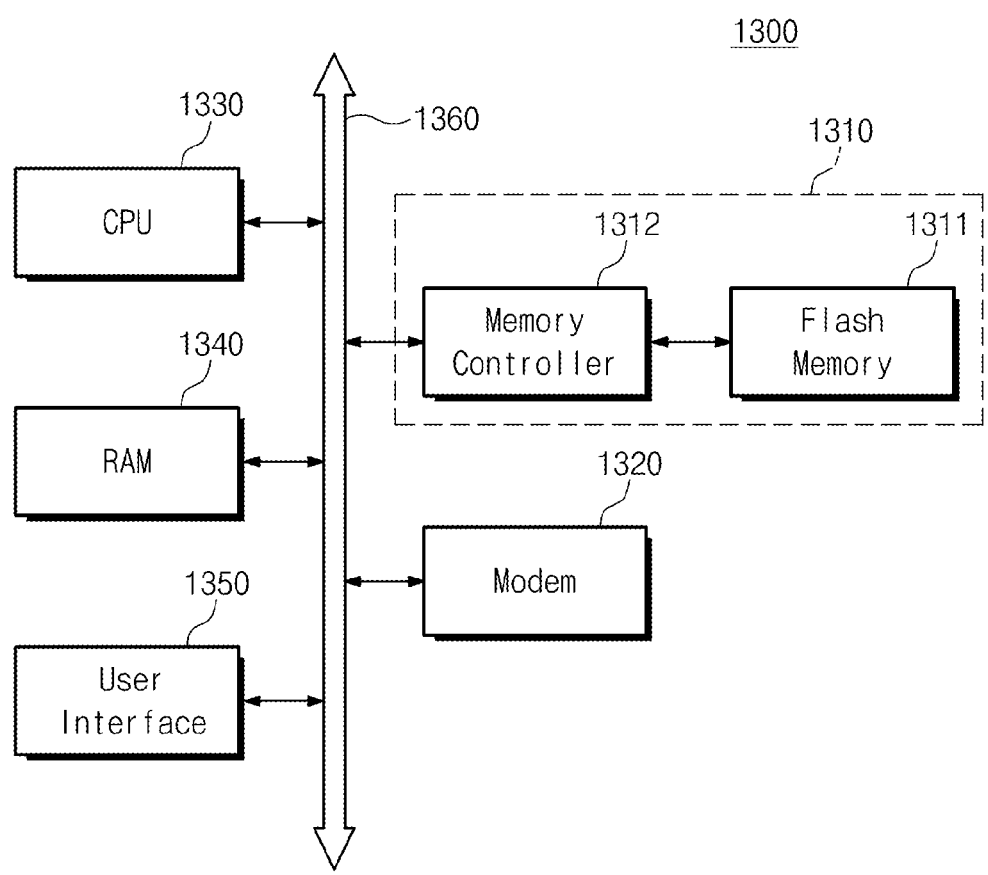
FIG. 23 is a block diagram of an information processing system including a semiconductor memory system according to the inventive concept.

FIG. 23 is illustrates an information processing system 1300 including a 3D semiconductor memory system 1310 comprising a 3 D semiconductor memory device, according to the inventive concept. Referring to FIG. 23, the semiconductor memory system 1310 may be mounted to an information processing system such as a mobile device or a desktop computer. The information processing system 1300 of this example also includes a modem 1320, a central processing unit (CPU) 1330, a RAM 1340, and a user interface 1350, electrically connected to a system bus 1360. The semiconductor memory system 1310 may be configured similarly to that described with respect to FIG. 22, i.e., may have a 3D semiconductor memory device 1311, according to the inventive concept, and a memory controller 1312. Thus, the memory system 1310 may be a solid state drive SSD, and data processed by the CPU 1330 and/or input from the outside may be stored in the SSD.

An information processing system 1300, configured as described above so as to include a 3D semiconductor memory device according to the inventive concept, may reliably store a large amount of data in the semiconductor memory system 1310. Accordingly, the semiconductor memory system 1310 may conserve resources for error correction, and a high speed data exchange function may be provided. Although not shown in the drawing, it will be apparent to those of ordinary skill in the art that the information processing system 1300 may also include an application chipset, a camera image processor (CIS), and/or an input/output device.

Furthermore, a semiconductor memory device according to the inventive concept or memory system comprising the same may be packaged in various kinds of ways. For instance, the semiconductor memory device or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), or Wafer-level Processed Stack Package (WSP).

According to the inventive concept as described above, a 3D semiconductor device with a localized charge storing region is provided. Due to the localization of the charge storing region, it is possible to effectively prevent technical problems related to a charge spreading phenomena. In one embodiment, portions of the charge storing layer adjacent to the trench are removed, and this makes it possible for the semiconductor device to be fabricated without the charge spreading phenomena and thus to possess a high degree of reliability.

Finally, embodiments of the inventive concept and examples thereof have been described above in detail. The inventive concept may, however, be embodied in many different forms and should not be construed as being limited to the embodiments or examples described above. Rather, these embodiments and examples were described so that this disclosure is thorough and complete, and fully conveys the inventive concept to those skilled in the art. Thus, the true spirit and scope of the inventive concept is not limited by the embodiments or examples described above but by the following claims.

What is claimed is:

1. A method of fabricating a 3D semiconductor device, comprising:
    forming a mold structure, comprising interlayer dielectrics and sacrificial layers alternately disposed one over the other, on a substrate;
    forming an opening through the mold structure;
    recessing the interlayer dielectrics horizontally between the sacrificial layers, to thereby form under-cut regions at which the sacrificial layers are under-cut;
    forming a layer of charge storing material conformally over surfaces delimiting the opening and the recesses of the under-cut regions;
    forming a pattern of semiconductor material in the opening in which the charge storing layer has been formed; and
    replacing the sacrificial layers with electrically conductive patterns.

2. The method of claim 1, wherein the replacing of the sacrificial layers with conductive patterns comprises:
    forming a trench in the mold structure which exposes sidewall surfaces of the sacrificial layers;
    removing the exposed sacrificial layers to form recesses;
    depositing, in the trench, electrically conductive material that fills the recesses; and
    selectively etching the conductive material to remove conductive material from the trench and leave conductive material in the recesses.

3. The method of claim 2, wherein the replacing of the sacrificial layers with conductive patterns further comprises forming a blocking layer of electrically insulating material conformally over inner wall surfaces which delimit the trench and the recesses, before the conductive material is deposited in the trench.

4. The method of claim 1, wherein the horizontal recessing of the interlayer dielectrics comprises horizontally recessing sidewalls of the interlayer dielectrics to an etch depth smaller than a distance between the opening and the trench adjacent thereto.

5. The method of claim 1, further comprising removing the interlayer dielectrics between the conductive patterns to expose sidewalls of the charge storing layer in the under-cut regions, after the sacrificial layers are replaced with conductive patterns.

6. The method of claim 5, further comprising etching the exposed sidewalls of the charge storing layer away to divide the charge storing layer into a plurality of vertically separated portions, after the interlayer dielectrics have been removed.

* * * * *